United States Patent
Toguri et al.

(10) Patent No.: US 12,094,475 B2
(45) Date of Patent: Sep. 17, 2024

(54) SIGNAL PROCESSING DEVICE AND SIGNAL PROCESSING METHOD, AND PROGRAM

(71) Applicant: Sony Group Corporation, Tokyo (JP)

(72) Inventors: Yasuhiro Toguri, Kanagawa (JP); Yoshiaki Oikawa, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 306 days.

(21) Appl. No.: 17/626,771

(22) PCT Filed: Jul. 3, 2020

(86) PCT No.: PCT/JP2020/026170
§ 371 (c)(1),
(2) Date: Jan. 12, 2022

(87) PCT Pub. No.: WO2021/014933
PCT Pub. Date: Jan. 28, 2021

(65) Prior Publication Data
US 2022/0262374 A1    Aug. 18, 2022

(30) Foreign Application Priority Data
Jul. 19, 2019   (JP) .................................. 2019-133695

(51) Int. Cl.
*G10L 19/02*   (2013.01)
*G10L 19/008*   (2013.01)
(Continued)

(52) U.S. Cl.
CPC ............ *G10L 19/02* (2013.01); *G10L 19/008* (2013.01); *H04R 5/04* (2013.01); *H04S 7/307* (2013.01)

(58) Field of Classification Search
CPC ......... G10L 19/02; G10L 19/008; H04R 5/04; H04S 7/307
(Continued)

(56) References Cited

U.S. PATENT DOCUMENTS

2009/0138271 A1   5/2009   Christensen
2011/0307248 A1   12/2011  Yamanashi
(Continued)

FOREIGN PATENT DOCUMENTS

CN   101009952 A   8/2007
CN   101958120 A   1/2011
(Continued)

OTHER PUBLICATIONS

International Written Opinion and English translation thereof mailed Sep. 15, 2020 in connection with International Application No. PCT/JP2020/026170.
(Continued)

*Primary Examiner* — George C Monikang
(74) *Attorney, Agent, or Firm* — Wolf, Greenfield & Sacks, P.C.

(57) ABSTRACT

The present technology relates to a signal processing device, a signal processing method, and a program for enabling reproduction of high-quality sounds with a low process load. The signal processing device includes a demultiplexing section that extracts encoded audio signals and overamplitude flags, which have been generated for a plurality of respective panel loudspeakers and each indicate whether overamplitude will occur in the corresponding panel loudspeaker, by demultiplexing encoded data, a decoding section that decodes the encoded audio signals, and an adjustment section that adjusts audio signals to be supplied to the plurality of panel loudspeakers on the basis of the overamplitude flags and audio signals resulting from the decoding.

(Continued)

The present technology is applicable to an encoding device and a decoding device.

20 Claims, 25 Drawing Sheets

(51) Int. Cl.
*H04R 5/04* (2006.01)
*H04S 7/00* (2006.01)

(58) Field of Classification Search
USPC .............................................. 381/22, 23, 62
See application file for complete search history.

(56) References Cited

U.S. PATENT DOCUMENTS

| | | |
|---|---|---|
| 2015/0066518 A1 | 3/2015 | Beack |
| 2015/0097658 A1 | 4/2015 | Yagi |
| 2018/0249248 A1 | 8/2018 | Harris |
| 2019/0028787 A1 | 1/2019 | Masuda et al. |
| 2019/0191240 A1 | 6/2019 | Ham et al. |

FOREIGN PATENT DOCUMENTS

| | | |
|---|---|---|
| CN | 202364332 U | 8/2012 |
| CN | 102947881 A | 2/2013 |
| CN | 107637097 A | 1/2018 |
| JP | 2014175776 A | 9/2014 |
| JP | 2019070823 A | 5/2019 |
| KR | 20190074540 A | 6/2019 |
| WO | WO-2013006330 A2 | 1/2013 |
| WO | WO-2013006338 A2 | 1/2013 |
| WO | WO 2018/123310 A1 | 7/2018 |
| WO | WO 2018/154302 A1 | 8/2018 |

OTHER PUBLICATIONS

International Preliminary Report on Patentability and English translation thereof mailed Feb. 3, 2022 in connection with International Application No. PCT/JP2020/026170.

Extended European Search Report issued Aug. 29, 2022 in connection with European Application No. 20843473.8.

International Search Report and English translation thereof mailed Sep. 15, 2020 for International Application No. PCT/JP2020/026170.

FIG. 3

| Syntax | Num. of bits |
|---|---|
| audio_encoded_data () {<br>　⋮<br>　encoded_channel_data ( );<br>　for (i=0; i<Number_of_PanelConfig; i++) {<br>　　for (k=0; k<Num_of_SubPanels[i]; k++) {<br>　　　Panel_Control_Flag[i][k]; | 1 |
| 　　}<br>　}<br>} | |

FIG. 10

| Syntax | Num. of bits |
|---|---|
| audio_encoded_data () { | |
| ⋮ | |
| encoded_channel_data (); | |
| ⋮ | |
| for (i =0; i <Number_of_PanelConfig; i++) { | |
|   for (k=0; k<Num_of_SubPanels[i]; k++) { | |
|     Panel_Control_Flag[i][k]; | 1 |
|     if(Panel_Control_Flag[i][k]==1) { | |
|       for (p =0; p<8; p++) { | |
|         Panel_Gain[p]; | 3 |
|       } | |
|       Panel_Gain_SubWf; | 3 |
|     } | |
|   } | |
| } | |
| } | |

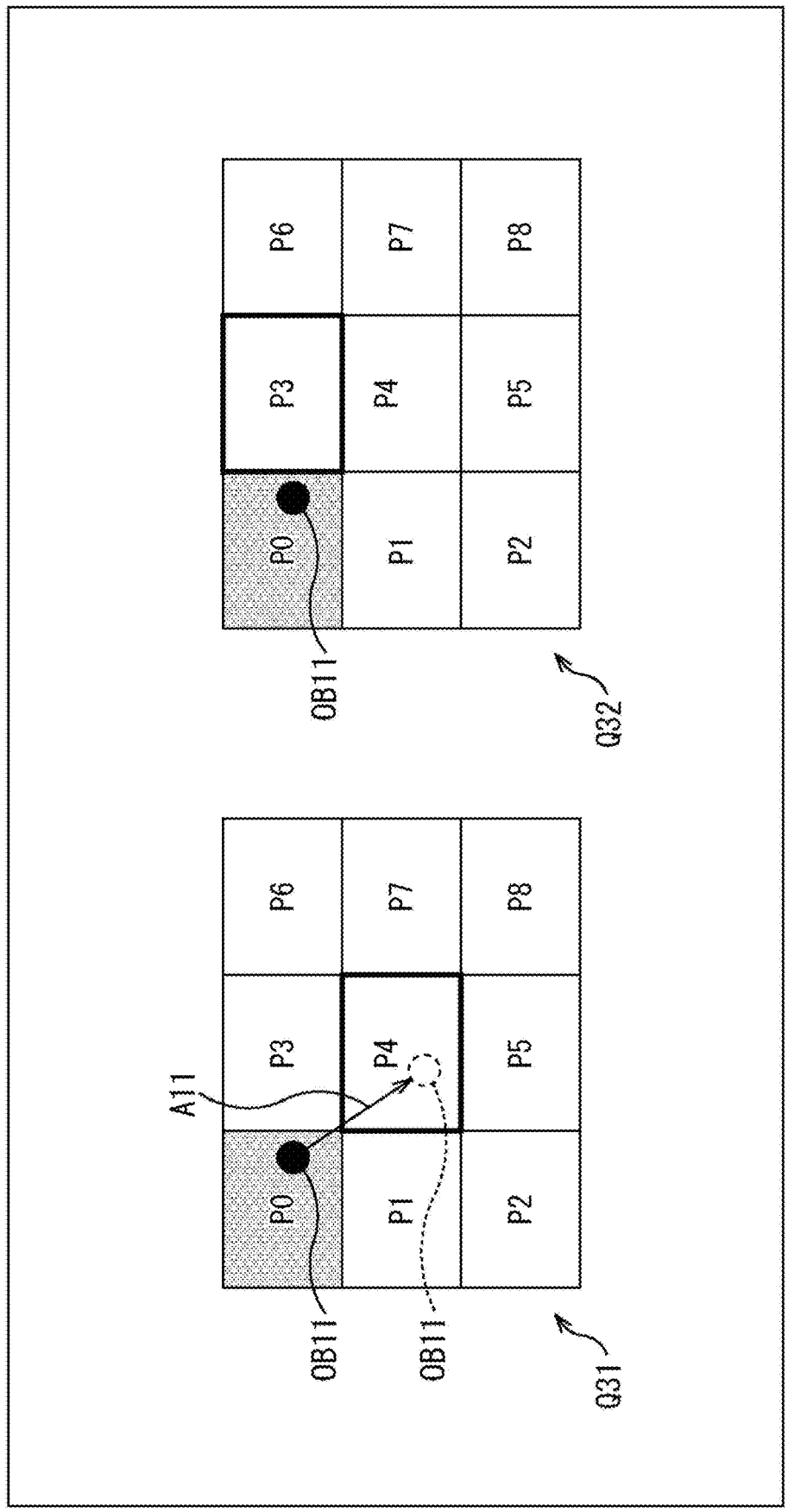

FIG. 17

| Syntax | Num. of bits |
|---|---|
| audio_encoded_data(){ <br>   : <br>   encoded_channel_data(); <br>   : <br>   for(i=0; i<Number_of_PanelConfig; i++){ <br>     for(k=0; k<Num_of_SubPanels[i]; k++){ <br>       Panel_Control_Flag[i][k]; <br>       if(Panel_Control_Flag[i][k]==1){ <br>         object_exist; <br>         if(object_exist){ <br>           Panel_relative_id; <br>           Panel_Gain; <br>         } <br>         else{ <br>           for(p=0; p<8; p++){ <br>             Panel_Gain[p]; <br>           } <br>         } <br>         Panel_Gain_SubWf; <br>       } <br>     } <br>   } <br> } | <br><br><br><br><br><br>1<br>1<br><br>3<br>3<br><br><br>3<br><br><br>3 |

FIG.18

| Syntax | Num. of bits |
|---|---|
| object_metadata() {<br>　...<br>　　object_index;<br>　　position_azimuth;<br>　　position_elevation;<br>　　position_radius;<br>　　gain_factor;<br>　　dynamic_object_priority;<br>　...<br>} | <br><br>3<br>3<br>3<br>3<br>3<br>3<br> |

FIG. 25

| NUMBER OF PANELS \ MAXIMUM NUMBER OF OBJECTS | 1~15 | 16~63 | 64~ |
|---|---|---|---|
| 1~2 | Lev-1 | Lev-1 | Lev-2 |
| 3~9 | Lev-1 | Lev-2 | Lev-3 |
| 9~ | Lev-2 | Lev-3 | Lev-3 |

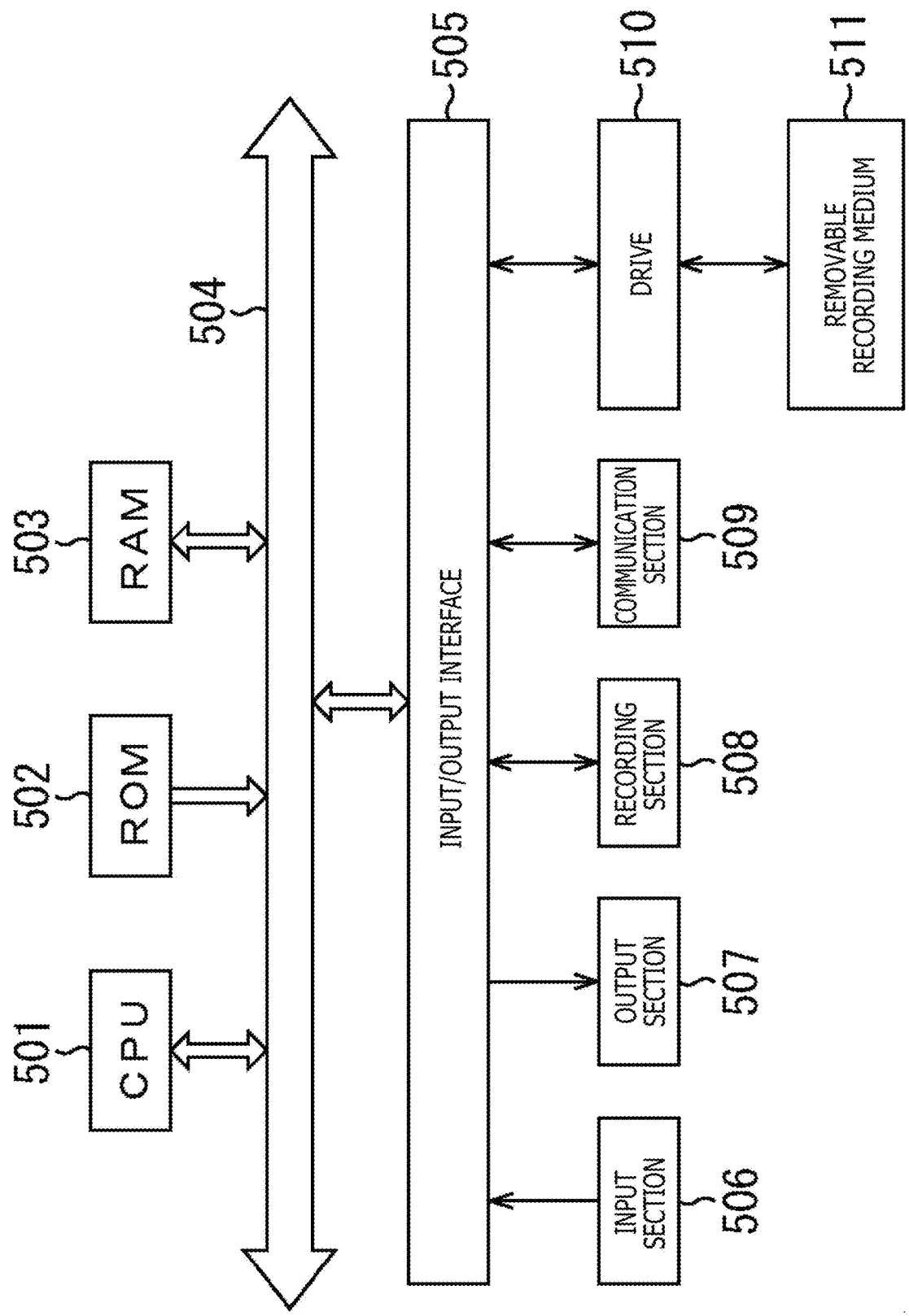

SIGNAL PROCESSING DEVICE AND SIGNAL PROCESSING METHOD, AND PROGRAM

CROSS-REFERENCE TO RELATED APPLICATIONS

This application claims the benefit under 35 U.S.C. § 371 as a U.S. National Stage Entry of International Application No. PCT/JP2020/026170, filed in the Japanese Patent Office as a Receiving Office on Jul. 3, 2020, which claims priority to Japanese Patent Application Number JP2019-133695, filed in the Japanese Patent Office on Jul. 19, 2019, each of which is hereby incorporated by reference in its entirety.

TECHNICAL FIELD

The present technology relates to a signal processing device, a signal processing method, and a program, and particular, relates to a signal processing device, a signal processing method, and a program for enabling reproduction of high-quality sounds with an especially low process load.

BACKGROUND ART

In recent years, what is called panel loudspeaker systems have become widespread. In such a panel loudspeaker system, an actuator excites a panel of a television or the like for displaying videos so that sounds are reproduced.

In a panel loudspeaker system of such a type, the position of a panel functioning as a loudspeaker may be displaced according to overamplitude in the panel, or blur or distortion may occur in a video being displayed on the panel. Therefore, a certain amount or more of vibration of the panel needs to be prevented, that is, occurrence of overamplitude needs to be prevented.

Particularly in a dark part of the video, when the panel vibrates, reflection light from the panel appears blurred. Accordingly, blur in the video is likely to become obtrusive.

To this end, a content reproducing-side device predicts vibration of a panel from an audio signal level, and, in a case of detecting vibration at a certain level or higher, suppresses the signal level or cuts a partial band of the signal in order to prevent overamplitude in the panel.

In addition, in a flat panel loudspeaker for outputting sounds by vibrating a flat panel by means of an exciter, for example, a technology for inhibiting generation of a large standing wave by disposing the exciter so as to avoid a position where vibration can be most easily caused in the entire sound frequency, has been suggested (for example, see PTL 1).

CITATION LIST

Patent Literature

PTL 1

PCT Patent Publication No. WO2018/123310

SUMMARY

Technical Problems

However, with the above-mentioned technology, it has been difficult to, in a case where sounds are reproduced by means of a panel loudspeaker equipped with a panel-shaped vibration plate, reproduce high-quality sounds while suppressing a process load at a reproduction side.

For example, to reproduce sounds while a reproduction-side device is conducting overamplitude detection, a computation resource at the reproduction-side is required. Moreover, if the device attempts to detect sudden overamplitude, a process delay such as buffering may occur.

Furthermore, if a signal level is simply suppressed in a case where overamplitude is detected by the reproduction-side device, a desired sound pressure level cannot be obtained, in some cases. This degrades the sound quality.

The present technology has been made in view of the above circumstances, and enables reproduction of high-quality sounds with a low process load.

Solution to Problems

A signal processing device according to a first aspect of the present technology includes a demultiplexing section that demultiplexes encoded data to extract encoded audio signals and overamplitude flags having been generated for a plurality of respective panel loudspeakers and each indicating whether overamplitude will occur in the corresponding panel loudspeaker, a decoding section that decodes the encoded audio signals, and an adjustment section that adjusts audio signals to be supplied to the plurality of the respective panel loudspeakers on the basis of the overamplitude flags and audio signals resulting from the decoding.

A signal processing method or a program according to the first aspect of the present technology includes the steps of demultiplexing encoded data to extract encoded audio signals and overamplitude flags having been generated for a plurality of respective panel loudspeakers and each indicating whether overamplitude will occur in the corresponding panel loudspeaker, decoding the encoded audio signals, and adjusting audio signals to be supplied to the plurality of the respective panel loudspeakers on the basis of the overamplitude flags and audio signals resulting from the decoding.

In the first aspect of the present technology, the encoded data is demultiplexed, encoded audio signals and overamplitude flags, which have been generated for a plurality of respective panel loudspeakers and each indicate whether overamplitude will occur in the corresponding panel loudspeaker, are extracted, the encoded audio signals are decoded, and audio signals to be supplied to the plurality of the respective panel loudspeakers are adjusted on the basis of the overamplitude flags and audio signals resulting from the decoding.

A signal processing device according to a second aspect of the present technology includes an overamplitude detection section that detects whether, when each of a plurality of respective panel loudspeakers reproduces a sound based on an audio signal, overamplitude will occur in the corresponding panel loudspeaker, and generates overamplitude flags indicating the detection results, an encoding section that encodes the audio signals, and a multiplexing section that generates encoded data by multiplexing the overamplitude flags for the plurality of the respective panel loudspeakers and encoded audio signals resulting from the encoding.

A signal processing method or a program according to the second aspect of the present technology includes the steps of detecting whether, when each of a plurality of panel loudspeakers reproduces a sound based on an audio signal, overamplitude will occur in the panel loudspeaker, and generating overamplitude flags indicating the detection results, encoding the audio signals, and generating encoded data by multiplexing the overamplitude flags for the plurality of the respective panel loudspeakers and encoded audio signals resulting from the encoding.

In the second aspect of the present technology, whether, when each of a plurality of respective panel loudspeakers reproduces a sound based on an audio signal, overamplitude will occur in the corresponding panel loudspeaker, is detected, and overamplitude flags indicating the detection results are generated, the audio signals are encoded, and the overamplitude flags for the plurality of the respective panel loudspeakers and encoded audio signals resulting from the encoding are multiplexed to generate encoded data.

BRIEF DESCRIPTION OF DRAWINGS

FIG. 3 is a diagram illustrating a format example of encoded data.
FIG. 10 is a diagram illustrating a format example of encoded data.
FIG. 16 is a diagram for explaining adjustment of an allocation destination panel loudspeaker.
FIG. 17 is a diagram illustrating a format example of encoded audio data.
FIG. 18 is a diagram illustrating a format example of encoded OAM.
FIG. 25 is a diagram for explaining a pre-rendering level.
FIG. 26 is a diagram illustrating a configuration example of a computer.

DESCRIPTION OF EMBODIMENTS

Hereinafter, embodiments to which the present technology is applied will be explained with reference to the drawings.

First Embodiment

<Panel Loudspeaker System>

The present technology relates to a panel loudspeaker system including a combination of a plurality of panel loudspeakers that output sounds by vibrating panel-shaped (plate-shaped) vibration plates.

In particular, according to the present technology, a content encoding side detects whether or not overamplitude occurs in each panel loudspeaker, whereby a process load at a decoding side (reproduction side) can be reduced.

In addition, according to the present technology, a part of an output to a panel loudspeaker in which occurrence of overamplitude has been detected is allocated, at the decoding side, to another adjoining panel loudspeaker, whereby a desired sound pressure level can be ensured, and high-quality sounds can be reproduced.

Hereinafter, the present technology will be more specifically explained.

Figure 1:
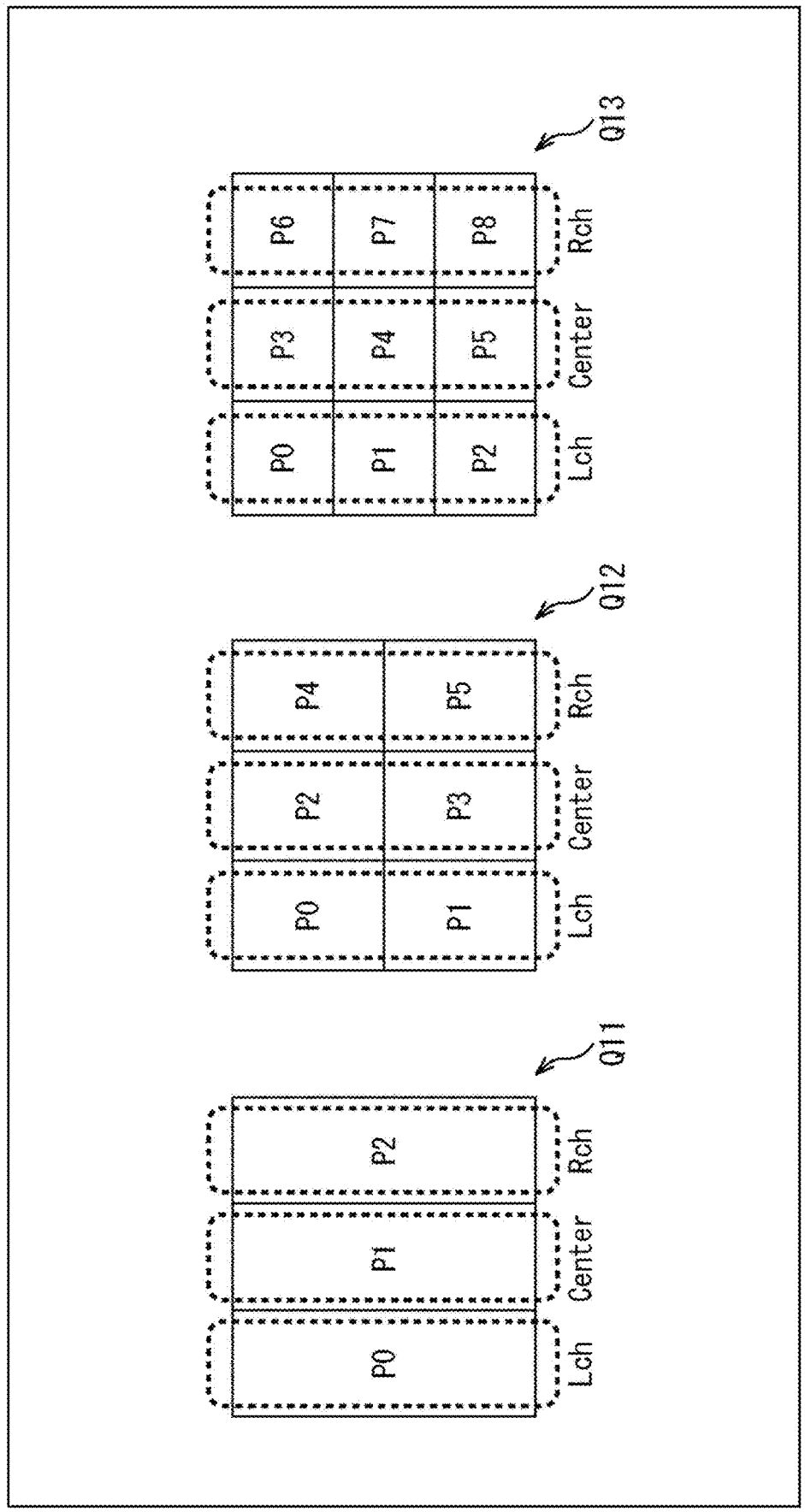
FIG. 1 is a diagram for explaining a common panel structure.

FIG. 1 illustrates an example of a panel structure in a typical panel loudspeaker system.

The panel structure is about the number of panel loudspeakers or the number of panels, the arrangement positions (arrangement pattern) of the respective panel loudspeakers, the panel sizes or panel shapes of the respective panel loudspeaker, and the like, in a case where a plurality of panel loudspeakers is arranged to form one large panel.

In an example indicated by an arrow Q11 in FIG. 1, three panel loudspeakers P0, P1, and P2 are arranged side by side in the wide direction in the drawing.

Further, respective panel parts of the panel loudspeakers P0 to P2 form one panel. This one panel also functions as a display panel for displaying a video, for example.

In other words, the whole display panel is divided into three regions which are long in the longitudinal direction. These regions are the panel loudspeakers P0 to P2, respectively.

In particular, in this example, the panel loudspeakers P0 to P2 correspond to a left channel, a center channel, and a right channel, respectively. Therefore, for example, the panel loudspeaker P0 vibrates on the basis of an audio signal of the left channel, and outputs a sound.

In an example indicated by an arrow Q12, a display panel is divided into six regions, and respective panels in the divided regions are defined as panel loudspeakers P0 to P5.

In particular, the panel loudspeakers P0 and P1 correspond to a left channel, the panel loudspeakers P2 and P3 corresponds to a center channel, and the panel loudspeakers P4 and P5 correspond to a right channel.

In an example indicated by an arrow Q13, a display panel is divided into nine regions, respective panels in the divided regions are defined as panel loudspeakers P0 to P8.

In particular, the panel loudspeakers P0 to P2 correspond to a left channel, the panel loudspeakers P3 to P5 correspond to a center channel, and the panel loudspeakers P6 to P8 correspond to a right channel.

It is to be noted that the panel structures and allocation of channels to panel loudspeakers in each panel structure illustrated in FIG. 1 are just examples. The panel structure and the allocation of channels can be desirably determined.

In panel loudspeaker systems, various types of a panel structure can be implemented, as described above. However, since the specifications and standards of television receiving devices are specified by the ARIB (Association of Radio Industries and Businesses) normal standard, the panel structure of a television having the panel loudspeaker system installed therein can be specified by the normal standard.

Accordingly, an explanation herein will be given on the assumption that several kinds of panel structures and channel allocating methods for the respective panel structures are preliminarily specified.

Configuration Example of Encoding-Side Signal Processing Device

Figure 2:
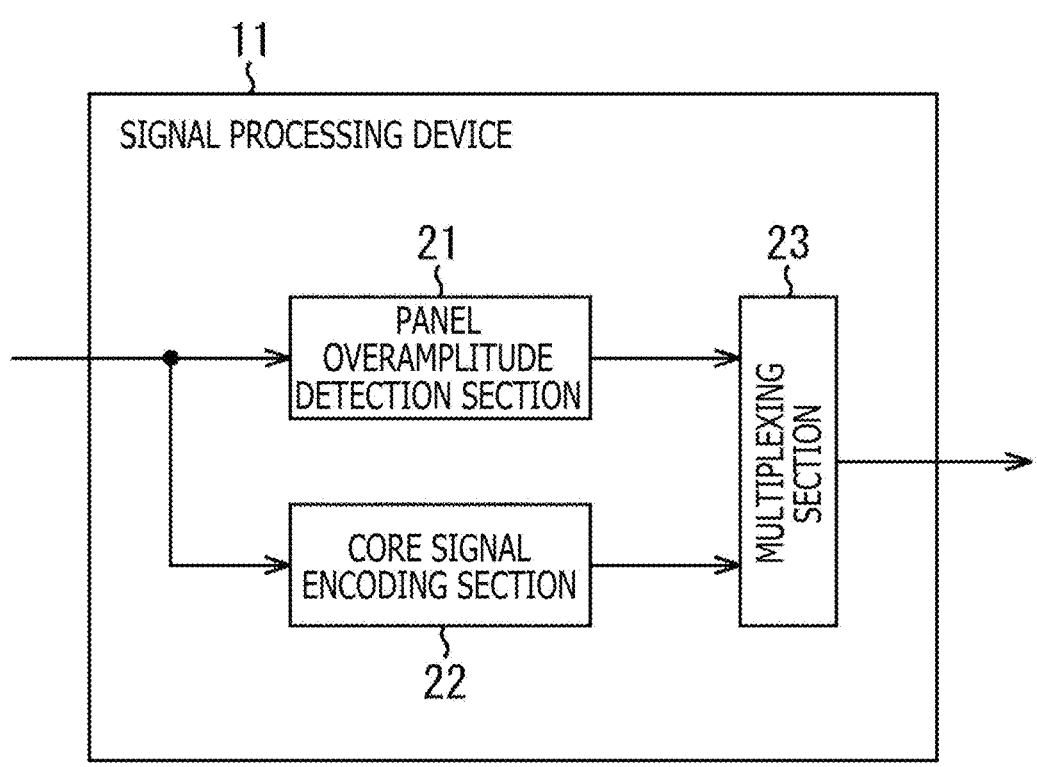
FIG. 2 is a diagram illustrating a configuration example of a signal processing device.

FIG. 2 is a diagram illustrating a configuration example of an encoding-side signal processing device to which the present technology is applied.

A signal processing device 11 illustrated in FIG. 2 functions as an encoding device that encodes an audio signal of sound-including content, which may be content including a video and sounds, for example, and transmits (outputs) the resultant encoded data.

The signal processing device 11 includes a panel overamplitude detection section 21, a core signal encoding section 22, and a multiplexing section 23.

As content audio signals, channel audio signals of respective channels constituting multichannel signals are supplied to the panel overamplitude detection section 21 and the core signal encoding section 22. The channel audio signals of the respective channels are audio signals for reproducing sounds of the corresponding channels.

The panel overamplitude detection section 21 detects whether overamplitude will occur in each panel loudspeaker in each of a plurality of different panel structures that are preliminarily defined, on the basis of the supplied channel audio signals, and supplies overamplitude flags that indicate the detection results, to the multiplexing section 23.

That is, a panel loudspeaker to become an output destination of a channel audio signal of each channel is preliminarily determined (defined) in each of the panel structures.

The panel overamplitude detection section 21 detects whether or not overamplitude will occur when each panel loudspeaker is driven on the basis of the corresponding channel audio signal, that is, when a sound based on the channel audio signal is reproduced by the panel loudspeaker.

For example, an overamplitude flag having a value of "1" indicates that overamplitude will occur in the corresponding panel loudspeaker, while an overamplitude flag having a value of "0" indicates that no overamplitude will occur in the corresponding panel loudspeaker.

The core signal encoding section 22 encodes the channel audio signals supplied thereto by a prescribed audio encoding method, and supplies the resultant encoded audio signals to the multiplexing section 23.

For example, as the audio encoding method for the channel audio signals, an audio encoding method defined by ARIB STD-B32, which is a standard, is used.

It is to be noted that the encoded audio signals obtained by the core signal encoding section 22 may be decoded, and the resultant decoded channel audio signals may be inputted to the panel overamplitude detection section 21 so that whether or not overamplitude will occur can be detected. In this case, overamplitude can be detected with higher precision.

The multiplexing section 23 multiplexes the overamplitude flags supplied from the panel overamplitude detection section 21 and the encoded audio signals supplied from the core signal encoding section 22 by a prescribed format, and transmits the resultant encoded data to a decoding-side device.

Format Example of Encoded Data

Here, a format example of encoded data that is obtained by the multiplexing section 23 will be explained. The encoded data is multiplexed by a format illustrated in FIG. 3, for example.

In the example in FIG. 3, a character string "audio_encoded_data( )" indicates encoded data of a prescribed audio frame, and a character string "encoded_channel_data( )" indicates an encoded audio signal of one audio frame encoded by a prescribed audio encoding method.

A character string "Number_of_PanelConfig" indicates the number of patterns of preliminarily defined panel structures. A character string "Num_of_SubPanels[i]" indicates the number of panels, that is, the number of panel loudspeakers constituting the i-th panel structure pattern.

A character string "Panel_Control_Flag[i][k]" indicates an overamplitude flag for the k-th panel loudspeaker in the i-th panel structure pattern. The overamplitude flag is expressed by 1 bit.

In the above-mentioned manner, in the signal processing device 11, encoded data is generated by multiplexing of encoded audio signals and overamplitude flags in each audio frame (hereinafter, simply referred to a frame), and is transferred to a decoding-side device.

In addition, in each frame, overamplitude flags that each indicate whether or not, when each of panel loudspeakers in each of a plurality of preliminarily defined panel structures reproduces a sound based on a channel audio signal, overamplitude will occur in the panel loudspeaker, are generated for the respective panel loudspeakers.

<Explanation of Encoding Process>

Next, operation of the signal processing device 11 will be explained.

Specifically, an encoding process which is executed by the signal processing device 11 will be explained below with reference to the flowchart in FIG. 4. The encoding process is started when channel audio signals of one frame are supplied to the signal processing device 11.

At Step S11, on the basis of the supplied channel audio signals, the panel overamplitude detection section 21 detects whether overamplitude will occur in each of panel loudspeakers in each of preliminarily defined panel structures.

For example, as explained above, a plurality of panel structures is preliminarily defined. In each of the panel structures, a channel to be allocated is also preliminarily determined for each panel loudspeaker. That is, for each panel loudspeaker, a channel the channel audio signal of which is to be supplied thereto is preliminarily determined.

Here, one of panel loudspeakers in a prescribed panel structure will be discussed. Even if the signal level of a channel audio signal being supplied to the panel loudspeaker is constant, vibration of the panel (vibration plate) of the panel loudspeaker becomes larger near the resonance frequency of the panel loudspeakers.

Therefore, by using amplitude characteristics of each of the panel loudspeakers in a certain panel structure, which are prepared for each of the preliminarily defined panel structures, the panel overamplitude detection section 21 predicts (estimates) the amplitude of the panel loudspeaker from the corresponding channel audio signal.

Specifically, for example, the panel overamplitude detection section 21 preliminarily holds an amplitude prediction filter that approximates the amplitude characteristics of each of the panel loudspeaker in each of the panel structures.

By filtering channel audio signals being supplied to the panel loudspeaker by means of the held amplitude prediction filter, the panel overamplitude detection section 21 predicts the amplitude value of the panel loudspeaker when the panel loudspeaker reproduces a sound based on a channel audio signal.

Further, in a case where the amplitude value (hereinafter, also referred to as predicted amplitude value) of the panel loudspeaker obtained by the prediction is greater than an upper limit value, that is, in a case where the predicted amplitude value is greater than the upper limit value, the panel overamplitude detection section 21 determines that overamplitude will occur, and generates an overamplitude flag indicating "1."

On the other hand, in a case where the predicted amplitude value of the panel loudspeaker is equal to or less than the upper limit value, the panel overamplitude detection section 21 determines that no overamplitude will occur, and generates an overamplitude flag indicating "0."

After generating overamplitude flags for respective panel loudspeakers in each of the panel structures in the above-mentioned manner, the panel overamplitude detection section 21 supplies the overamplitude flags to the multiplexing section 23.

It is to be noted that, when the amplitude value of a panel loudspeaker is constant but a video being displayed on a panel which constitutes the panel loudspeaker and functions as both a vibration plate and a display section is dark, a blur or distortion in the video becomes more obtrusive.

Therefore, the upper limit value of an amplitude of a panel loudspeaker may be dynamically defined on the basis of the brightness value of a video (image) being displayed on a panel part of the panel loudspeaker and the amplitude characteristic of the panel loudspeaker (e.g. the maximum amplitude value), for example.

At Step S12, the core signal encoding section 22 encodes the supplied channel audio signals by a prescribed audio encoding method, and supplies the resultant encoded audio signals to the multiplexing section 23.

At Step S13, the multiplexing section 23 multiplexes the overamplitude flags supplied from the panel overamplitude detection section 21 and the encoded audio signals supplied from the core signal encoding section 22 by a prescribed format. As a result, the encoded data illustrated in FIG. 3, for example, is obtained.

At Step S14, the multiplexing section 23 transmits the encoded data obtained at Step S13, to a decoding-side device. Then, the encoding process is completed.

It is to be noted that the encoded data may be transmitted to the decoding-side device wiredly or wirelessly, may be outputted and recorded into a removable recording medium or the like, or may be supplied to a prescribed content distribution server or the like, for example.

As explained so far, the signal processing device 11 detects whether or not overamplitude will occur in each of the panel loudspeakers in each of the panel structures, and generates overamplitude flags indicating the detection results. Then, the signal processing device 11 generates encoded data by multiplexing the overamplitude flags and encoded audio signals.

Since the signal processing device 11 which is the encoding side conducts detection of overamplitude, a process load on the decoding-side device can be reduced.

In addition, since the generated overamplitude flags and the encoded audio signals are transmitted to the decoding-side device, the decoding side can get to know a panel loudspeaker in which overamplitude will occur.

Accordingly, a part of an audio signal to be supplied to the panel loudspeaker in which overamplitude will occur, that is, a part of a sound pressure level based on the audio signal is allocated, at the decoding side, to adjoining separate panel loudspeakers so that a sufficient sound pressure level can be ensured, and high-quality sounds can be reproduced.

Configuration Example of Decoding-Side Signal Processing Device

Next, an explanation will be given of a decoding-side signal processing device that receives and decodes encoded data transmitted from the encoding-side signal processing device 11.

Figure 5:
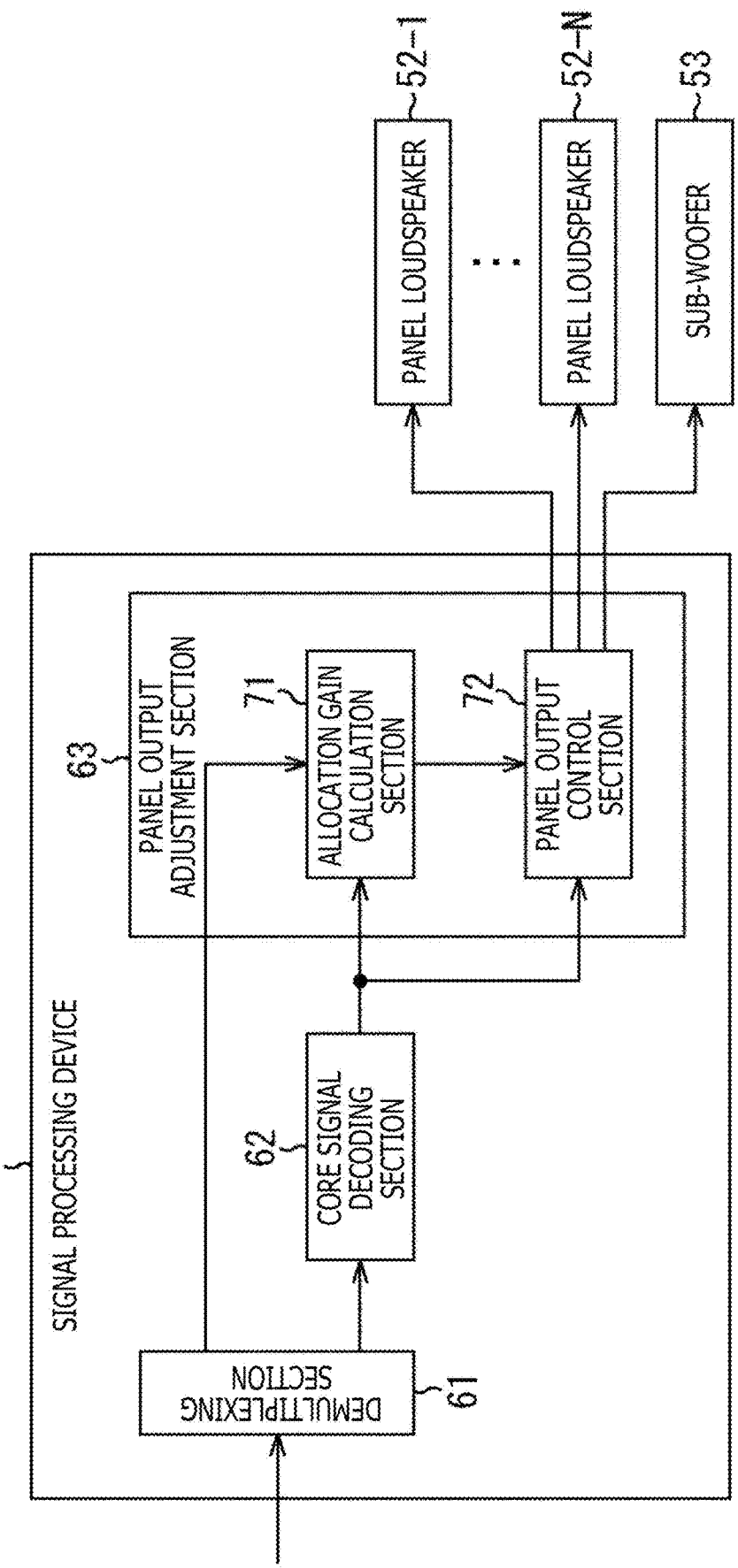
FIG. 5 is a diagram illustrating a configuration example of a signal processing device.

Such a decoding-side signal processing device has a configuration illustrated in FIG. 5, for example.

A signal processing device 51 illustrated in FIG. 5 functions as a decoding device that receives and decodes encoded data transmitted from the signal processing device 11, and also functions as a reproduction control device that supplies output signals to panel loudspeakers 52-1 to 52-N and a sub-woofer 53 to output sounds.

The panel loudspeakers 52-1 to 52-N and the sub-woofer 53 constitute a panel loudspeaker system, and are installed in a reproduction apparatus such as a television that reproduces videos and sounds.

For example, the respective panels of the panel loudspeakers 52-1 to 52-N each function as a loudspeaker's vibration plate, and further, each function as a display panel to display a content video.

In this case, the panels of the panel loudspeakers 52-1 to 52-N are tiled to function as one large display panel. The sizes, arrangement, and the number of the panels of the panel loudspeakers 52-1 to 52-N are identical to those in any one of the plurality of preliminarily determined panel structures.

It is to be noted that, in a case where the panel loudspeakers 52-1 to 52-N do not need to be distinguished from one another, the panel loudspeakers 52-1 to 52-N are simply referred to as the panel loudspeakers 52, hereinafter.

The sub-woofer 53 is a loudspeaker that reproduces sounds in a lower frequency band than the panel loudspeakers 52, and outputs a sound on the basis of an output signal supplied from the signal processing device 51.

It is to be noted that an example, in which the signal processing device 51 is separate from the panel loudspeaker system including the panel loudspeakers 52 and the sub-woofer 53, will be explained here. However, the signal processing device 51, the panel loudspeakers 52, and the sub-woofer 53 may be disposed in one reproduction apparatus such as a television.

The signal processing device 51 includes a demultiplexing section 61, a core signal decoding section 62, and a panel output adjustment section 63.

The demultiplexing section 61 receives encoded data transmitted from the multiplexing section 23 of the signal processing device 11, and extracts overamplitude flags and encoded audio signals from the received encoded data by demultiplexing the encoded data.

The demultiplexing section 61 supplies, among the overamplitude flags in each of the panel structures resulting from the demultiplexing, the overamplitude flags for the panel structure of the panel loudspeakers 52 to the panel output adjustment section 63, and further, supplies the encoded audio signals resulting from the demultiplexing to the core signal decoding section 62.

The core signal decoding section 62 decodes the encoded audio signals of channels, which are multichannel signals, supplied from the demultiplexing section 61, by a decoding method corresponding to the audio encoding method performed by the core signal encoding section 22, and supplies the resultant channel audio signals to the panel output adjustment section 63.

The panel output adjustment section 63 adjusts output signals which are to be supplied to the panel loudspeakers 52 and the sub-woofer 53 according to the panel structure of the panel loudspeakers 52, on the basis of the overamplitude flags supplied from the demultiplexing section 61 and the channel audio signals supplied from the core signal decoding section 62.

The panel output adjustment section 63 includes an allocation gain calculation section 71 and a panel output control section 72.

On the basis of the overamplitude flags supplied from the demultiplexing section 61 and the channel audio signals supplied from the core signal decoding section 62, the allocation gain calculation section 71 generates allocation gain information indicating an allocation gain of allocating a part of a channel audio signal to be supplied to a panel loudspeaker 52 in which overamplitude will occur, to another panel loudspeaker 52 or the sub-woofer 53.

In other words, the allocation gain calculation section 71 decides a panel loudspeaker 52 or the sub-woofer 53 which is an allocation destination of a channel audio signal of a channel in which overamplitude will occur, and an allocation gain of conducting the allocation, and generates allocation gain information indicating the result.

The allocation gain calculation section 71 supplies the generated allocation gain information and the overamplitude flags to the panel output control section 72.

It is to be noted that, hereinafter, a panel loudspeaker in which overamplitude will occur, that is, a panel loudspeaker that is an allocation source of a channel audio signal is also referred to as an allocation source panel loudspeaker, and a panel loudspeaker that is an allocation destination of a channel audio signal is also referred to as an allocation destination panel loudspeaker.

In addition, hereinafter, a panel loudspeaker adjoining to the allocation source panel loudspeaker is also referred to as adjoining panel loudspeaker.

On the basis of the channel audio signals supplied from the core signal decoding section 62 and the overamplitude flags and the allocation gain information supplied from the allocation gain calculation section 71, the panel output control section 72 generates output signals which are audio signals to be supplied to the panel loudspeakers 52 and the sub-woofer 53.

After generating respective output signals for the panel loudspeakers 52 and the sub-woofer 53, the panel output control section 72 supplies the generated output signals to the panel loudspeakers 52 and the sub-woofer 53 to output content sounds.

<Decision of Allocation Destination and Allocation Gain>

Here, processes which are performed by the allocation gain calculation section 71 and the panel output control section 72, that is, decision of the panel loudspeakers 52 and/or the sub-woofer 53 as allocation destinations, calculation of an allocation gain, and generation of output signals will be explained.

In a case where the value of the overamplitude flag for a panel loudspeaker 52 that corresponds to a prescribed channel CH1 indicates "0," that is, in a case where no overamplitude will occur in the panel loudspeaker 52, the channel audio signal of the channel CH1 is simply allocated to the corresponding panel loudspeaker 52 in accordance with a predefined method.

In this case, the channel audio signal of the channel CH1 is simply decided as an output signal to be supplied to the panel loudspeaker 52 corresponding to the channel CH1.

In other words, the channel audio signal of the channel CH1 is not allocated to the sub-woofer 53 or another panel loudspeaker 52 adjoining to the panel loudspeaker 52 corresponding to the channel CH1. Therefore, in this case, calculation of an allocation gain of the channel audio signal of the channel CH1 is not conducted.

In contrast, in a case where overamplitude will occur in a panel loudspeaker 52 corresponding to the prescribed channel CH1 because the value of the overamplitude flag for the panel loudspeaker 52 indicates "1," a part of the pressure sound level of the channel audio signal of the channel CH1 is allocated to the sub-woofer 53 or another panel loudspeaker 52 adjoining to the panel loudspeaker 52 corresponding to the channel CH1.

Then, an allocation gain indicating respective allocation amounts of the channel audio signal (sound pressure level) of the channel CH1 to the panel loudspeakers 52 and the sub-woofer 53 which are decided as allocation destinations is calculated.

In this case, the panel loudspeaker 52 corresponding to the channel CH1, and the panel loudspeakers 52 and the sub-woofer 53 decided as the allocation destinations are decided as output destinations of the channel audio signal of the channel CH1.

The allocation gain represents a gain of the channel audio signal of the channel CH1 when the channel audio signal of the channel CH1 is outputted (allocated) to the panel loudspeakers 52 and the sub-woofer 53 decided as the output destinations.

Figure 6:
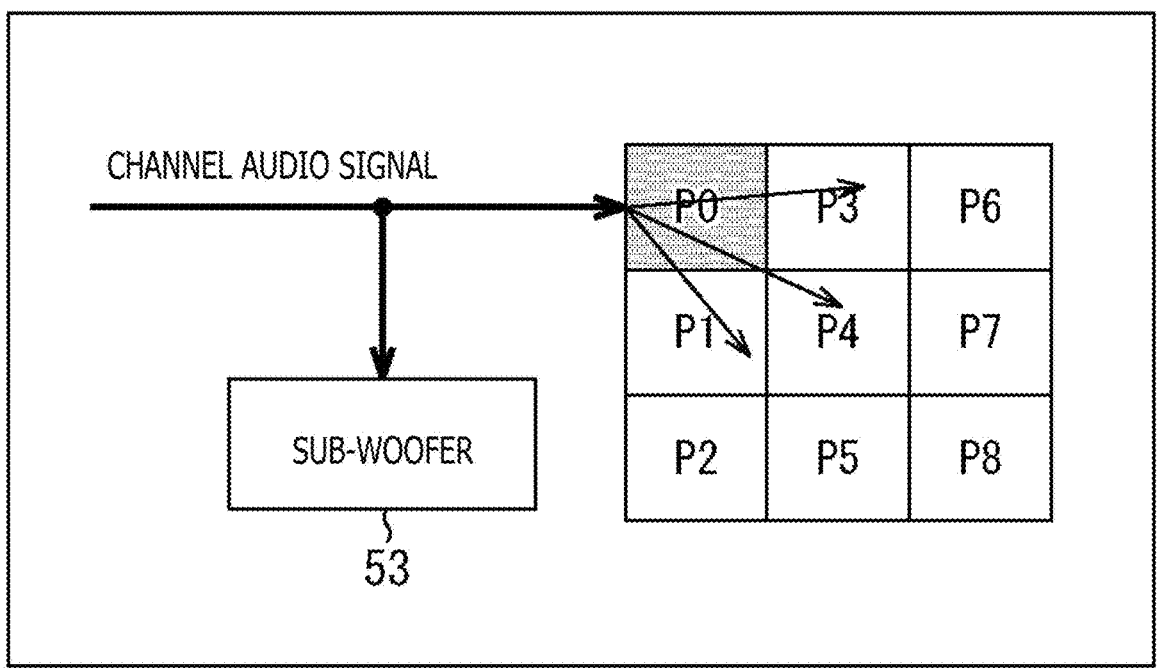
FIG. 6 is a diagram for explaining an example of allocation to adjoining panel loudspeakers.

For example, it is assumed that nine panel loudspeakers 52 are disposed, as illustrated in FIG. 6, for example.

In FIG. 6, quadrangles denoted by characters "P0" to "P8" each represent one of the panel loudspeakers 52. Hereinafter, a panel loudspeaker 52 represented by a quadrangle on which "Pi" (i=0, 1, . . . , 8) is indicated is also referred to as panel loudspeaker Pi.

It is assumed that overamplitude will occur in the panel loudspeaker P0 because the overamplitude flag for the panel loudspeaker P0 indicates "1."

In this case, a part of the sound pressure level of a channel audio signal initially intended to be supplied to the panel loudspeaker P0 is allocated to the sub-woofer 53 and the panel loudspeakers P1, P3, and P4 adjoining to the panel loudspeaker P0.

In a case where a part of the sound pressure level of a channel audio signal for the allocation source panel loudspeaker is allocated, an adjoining panel loudspeaker, among the adjoining panel loudspeakers, for which the overamplitude flag indicating "0" is set, is basically decided (selected) as an allocation destination.

However, the sound pressure level may be allocated preferentially to, among the adjoining panel loudspeakers for which the overamplitude flags indicating "0" are set, an adjoining panel loudspeaker in a channel that is the same as that of the allocation source panel loudspeaker.

Moreover, in this example, a part of the sound level is allocated to the adjoining panel loudspeakers. Therefore, in a certain channel, sounds of the channel are outputted not only from the allocation source panel loudspeaker but also from the allocation destination panel loudspeaker so that a localization position of the sound image is slightly displaced.

However, in this example, audio signals to be reproduced are channel audio signals of respective channels. Therefore, a listener does not perceive such a slight displacement of the sound image localization position. Accordingly, the sound image impression of the content sounds is not deteriorated.

Here, an explanation will be given of an example of a specific method for allocating a part of the sound level of a channel audio signal to an allocation destination panel loudspeaker.

Figure 7:
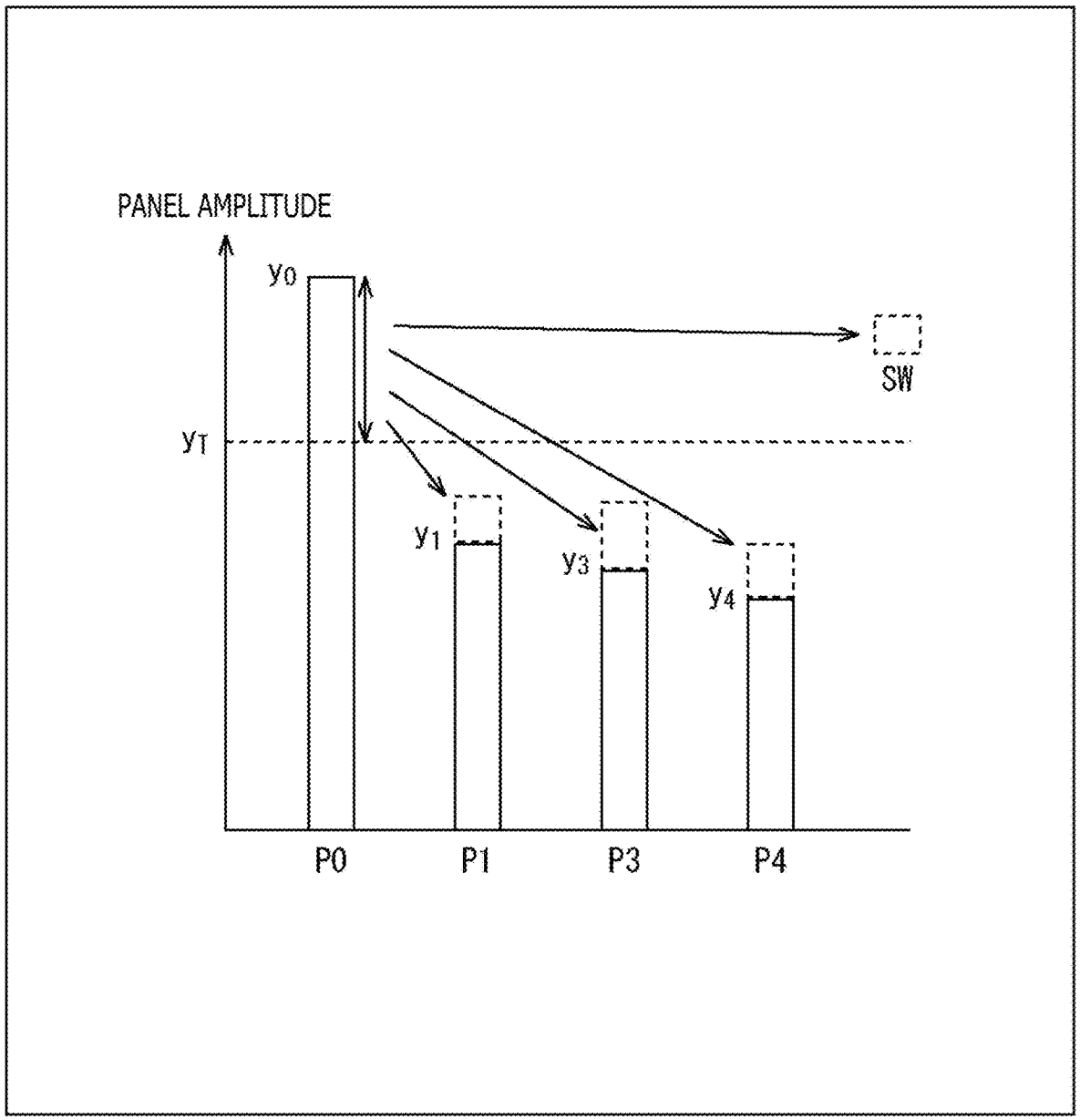
FIG. 7 is a diagram for explaining an example of allocation to adjoining panel loudspeakers.

For example, it is assumed that the amplitudes of panel loudspeakers 52 illustrated in FIG. 7 are obtained when the panel loudspeakers 52 are driven on the basis of the channel audio signals of the corresponding channels, that is, when sounds are outputted by the panel loudspeakers 52 on the basis of the channel audio signals.

It is to be noted that, in FIG. 7, the panel loudspeakers 52 are illustrated in the horizontal axis, and the amplitude values of the panel loudspeakers 52 are illustrated in the vertical axis. More specifically, the predicted amplitude values of the panel loudspeaker 52 are illustrated in the vertical axis.

In this case, $y_0$ to $y_4$ represent predicted amplitude values of the panel loudspeakers P0 to P4, respectively, and $y_T$ represents the upper limit of the amplitude values.

Therefore, overamplitude will occur in the panel loudspeaker P0, because the predicted amplitude value $y_0$ is greater than the upper limit $y_T$, while no overamplitude will occur in any of the remaining panel loudspeakers P1, P3, and P4 because the predicted amplitude values $y_1$, $y_3$, and $y_4$ are equal to or less than the upper limit $y_T$.

Since overamplitude will occur in the panel loudspeaker P0, a part, of an output level (sound pressure level) of the predicted amplitude value $y_0$, exceeding the upper limit $y_T$ is allocated to the adjoining panel loudspeakers P1, P3, and P4.

In allocation of the sound pressure level to the adjoining panel loudspeakers, the output level is allocated in proportion to an allowance (surplus) in each allocation destination panel loudspeaker to the upper limit value of the amplitude values, that is, the difference between the upper limit $y_T$ and each predicted amplitude value, as indicated by arrows in FIG. 7, for example.

The allocation is conducted such that occurrence of overamplitude in the allocation destination panel loudspeakers 52 is prevented, that is, none of the final predicted amplitude values after the allocation exceeds the upper limit $y_T$.

Moreover, the allocation of the sound pressure level of the channel audio signal to the adjoining panel loudspeakers 52 is conducted such that the sum of gains (allocation gains) of the allocation source panel loudspeaker 52 and the allocation destination panel loudspeakers 52 becomes 1. In other words, the allocation is conducted such that the sound pressure level of each channel does not change.

However, if occurrence of overamplitude in the allocation destination panel loudspeakers 52 is prevented, the sum of the allocation gains does not become 1. The sum may become less than 1. In such a case, the remaining part of the sound pressure level is allocated to the sub-woofer 53.

A specific calculation example in the above-mentioned allocation of a sound pressure level will be explained below.

Here, it is assumed that overamplitude will occur in the panel loudspeaker P0.

For example, it is assumed that $x_0$ represents a channel audio signal to be supplied to the panel loudspeaker P0, and a signal obtained by gain correction in which the channel audio signal $x_0$ is multiplied with a prescribed gain $g_0$, is used as an output signal $x_0'$ for the panel loudspeaker P0, as indicated by the following Expression (1).

[Math. 1]

$$x_0' = g_0 \times x_0 \qquad (1)$$

It is to be noted that, a gain, such as the gain $g_0$, for generating an output signal to be supplied to the allocation source panel loudspeaker 52 is also referred to as an allocation gain hereinbelow.

The allocation gain $g_0$ for the panel loudspeaker P0 indicated by Expression (1) can be obtained by comparison between the upper limit $y_T$ and the predicted amplitude value $y_0$ of the panel loudspeaker P0, as indicated by Expression (2), for example. When the allocation gain $g_0$ is determined in the above-mentioned manner, the amplitude value of the panel loudspeaker P0 reaches the upper limit $y_T$.

[Math. 2]

$$g_0 = \frac{y_T}{y_0} \qquad (2)$$

In addition, $x_i$ represents an output signal, of the panel loudspeaker Pi (i=1, 3, 4) which is an allocation destination of the sound pressure level for the panel loudspeaker P0, prior to allocation of the sound pressure level, or specifically, $x_i$ represents the channel audio signal of a channel corresponding to the allocation destination panel loudspeaker Pi, and $\alpha_i$ represents an allocation gain of the allocation destination panel loudspeaker Pi. In this case, the final output signal $x_i'$ which is obtained after allocation of the sound pressure level and is to be supplied to the allocation destination panel loudspeaker Pi, is obtained by Expression (3).

[Math. 3]

$$x_i' = x_i + \alpha_i \times x_0 (i \in S) \qquad (3)$$

It is to be noted that, in Expression (3), S represents a set of adjoining panel loudspeakers to which the sound pressure level can be allocated. Any adjoining panel loudspeaker for which an overamplitude flag indicating "1" is set is not included in the set S.

In Expression (3), a signal obtained by multiplying the channel audio signal $x_0$ for the panel loudspeaker P0 in which overamplitude will occur, with the allocation gain $\alpha_i$ of the allocation destination panel loudspeaker Pi, that is, the signal $\alpha_i x_0$ obtained by performing gain correction on the channel audio signal $x_0$ with the allocation gain $\alpha_i$ corresponds to a signal of a part allocated to the allocation destination panel loudspeaker Pi.

The sum of the signal $\alpha_i x_0$ and the channel audio signal $x_i$ is decided as the final output signal $x_i'$ for the allocation destination panel loudspeaker Pi.

For example, it is assumed that the channel audio signal $x_0$ is a signal for reproducing a sound of the prescribed channel CH0 and the channel audio signal $x_i$ is a signal for reproducing a sound of the channel CH1.

Here, when the panel loudspeaker Pi outputs a sound based on the output signal $x_i'$, a sound of the channel CH1 and a sound of a part of the channel CH0 corresponding to the allocation gain $\alpha_i$ are outputted from the panel loudspeaker Pi.

That is, a sound of the channel CH0 initially intended to be reproduced by the panel loudspeaker P0 alone, is reproduced by the panel loudspeaker P0 and the allocation destination panel loudspeaker Pi. It is to be noted that, in some panel structures, the channel audio signal $x_0$ and the channel audio signal $x_i$ may be signals of the same channel.

In the above-mentioned manner, a sufficient sound pressure level is ensured while occurrence of overamplitude in the panel loudspeaker P0 is prevented. Accordingly, high-quality sounds can be reproduced.

Calculation of the allocation gain $g_0$ and the allocation gain $\alpha_i$ is conducted by the allocation gain calculation section 71 in this manner. During the calculation, the maximum value $\alpha_i^{MAX}$ of the allocation gain $\alpha_i$ is determined, as indicated by Expression (4), such that an overamplitude value in the allocation destination panel loudspeaker does not exceed the upper limit $y_T$.

[Math. 4]

$$\alpha_i^{MAX} = (y_T - y_i)/y_0 \quad (4)$$

In Expression (4), $y_i$ represents an initial predicted original amplitude value of the allocation destination panel loudspeaker Pi. Therefore, in this example, the maximum value $\alpha_i^{MAX}$ is determined on the basis of the predicted amplitude value $y_i$ of the allocation source panel loudspeaker Pi, the predicted amplitude value $y_0$ of the allocation source panel loudspeaker P0, and the upper limit $y_T$.

It is to be noted that, in the above Expression (1) and Expression (4), each of the predicted amplitude values is only required to be obtained from an actual channel audio signal with use of an amplitude prediction filter or the like.

After the maximum value $\alpha_i^{MAX}$ of the allocation gain $\alpha_i$ of the allocation destination panel loudspeaker Pi is obtained, the allocation gain $\alpha_i$ of the allocation destination panel loudspeaker Pi is obtained by Expression (5) on the basis of the maximum value $\alpha_i^{MAX}$ of the allocation destination panel loudspeaker Pi and the allocation gain $g_0$.

[Math. 5]

$$\alpha_i = \frac{\alpha_i^{MAX}}{\sum_{i \in S} \alpha_i^{MAX}} \cdot (1 - g_0) \quad (5)$$

Obtaining the allocation gain $\alpha_i$ in this manner, means allocating the sound pressure level to the allocation destination panel loudspeaker Pi in proportion to an allowance (surplus) of the allocation destination panel loudspeaker Pi, that is, the difference between the predicted amplitude value $y_i$ and the upper limit $y_T$.

In addition, the sum of all the allocation gains is adjusted to become 1, as indicated by Expression (6). That is, Expression (6) is satisfied.

[Math. 6]

$$g_0 + \sum_{i \in S} \alpha_i = 1 \quad (6)$$

In a case where the allocation gain $\alpha_i$ is greater than the maximum value $\alpha_i^{MAX}$, the maximum value $\alpha_i^{MAX}$ is substituted for the allocation gain $\alpha_i$, as indicated by Expression (7), and a part, of the sound pressure level, exceeding the maximum value $\alpha_i^{MAX}$ is allocated to the sub-woofer 53. That is, $\beta$ indicated in Expression (8) is obtained as the allocation gain of the sub-woofer 53.

[Math. 7]

$$\alpha_i = \alpha_i^{MAX} \quad (7)$$

[Math. 8]

$$\beta = 1 - g_0 - \sum_{i \in S} \alpha_i^{MAX} \quad (8)$$

As a result of this allocation of the sound pressure level to the sub-woofer 53, as appropriate, the sum of all the allocation gains becomes 1. When the sum of all the allocation gains is adjusted to become 1 in this manner, a sound pressure level equivalent to that before the allocation can be ensured. That is, the sound pressure level is not degraded.

It is to be noted that, in a case where the sound pressure level of the channel audio signal $x_0$ is allocated to the sub-woofer 53 at the allocation gain $\beta$, the final output signal $x_{SW}'$ to the sub-woofer 53 is obtained, as indicated by Expression (9).

[Math. 9]

$$x_{SW}' = x_{SW} + \beta \times x_0 \quad (9)$$

In Expression (9), $x_{SW}$ represents a channel audio signal initially allocated to the sub-woofer 53, that is, a channel audio signal of a channel corresponding to the sub-woofer 53.

It is to be noted that, in a case where an overamplitude flag indicating "0" is not set for any one of the adjoining panel loudspeakers, only the sub-woofer 53 is an allocation destination of the channel audio signal for the allocation source panel loudspeaker.

The process of allocating a sound pressure level on the basis of overamplitude flags and channel audio signals, as described so far, can be performed with a lower process load (a smaller process amount), compared with a process of detecting whether or not overamplitude will occur for each of channel audio signals, and controlling amplitudes so as to prevent occurrence of overamplitude in accordance with the detection result. In particular, the difference in the process loads between these processes is large in a case where the number of channels is great.

In addition, since overamplitude flags are generated at the signal processing device 11 which is the encoding side, the signal processing device 51 which is the decoding side does not need to perform buffering etc., for detecting overamplitude. Accordingly, any reproduction delay, which is caused by buffering etc., does not occur.

<Explanation of Decoding Process>

Next, operation of the signal processing device 51 will be explained.

Specifically, a decoding process which is executed by the signal processing device 51, will be explained below with reference to the flowchart in FIG. 8. This decoding process is started when the demultiplexing section 61 of the signal processing device 51 receives encoded data of one frame.

At Step S41, the demultiplexing section 61 demultiplexes the received encoded data, and supplies obtained overamplitude flags to the allocation gain calculation section 71, and further, supplies obtained encoded audio signals to the core signal decoding section 62.

At Step S42, the core signal decoding section 62 decodes the encoded audio signals supplied from the demultiplexing section 61 by a decoding method that corresponds to the audio encoding method performed at the core signal encoding section 22, and supplies the resultant channel audio signals to the allocation gain calculation section 71 and the panel output control section 72.

At Step S43, the allocation gain calculation section 71 calculates an allocation gain of a panel loudspeaker 52 in which overamplitude will occur, on the basis of the overamplitude flags supplied from the demultiplexing section 61 and the channel audio signals supplied from the core signal decoding section 62.

The allocation gain calculation section 71 calculates the allocation gain $g_0$ of a panel loudspeaker 52 for which an overamplitude flag indicating "1" is set, by conducting calculation similar to that indicated by Expression (2), for example.

Also, the allocation gain calculation section 71 calculates the allocation gain $\alpha_i$ of an allocation destination panel loudspeaker 52 which adjoins to the allocation source panel loudspeaker 52 and for which an overamplitude flag indicating "0" is set, by conducting calculation of Expression (5).

It is to be noted that, if the allocation gain $\alpha_i$ is greater than the maximum value $\alpha_i^{MAX}$, the allocation gain calculation section 71 substitutes the maximum value $\alpha_i^{MAX}$ for the final allocation gain $\alpha_i$, as indicated by Expression (7).

Moreover, in a case where Expression (6) is not satisfied, the allocation gain calculation section 71 additionally decides the sub-woofer 53 as an allocation destination, and obtains the allocation gain $\beta$, of the sub-woofer 53 by conducting calculation of Expression (8).

After obtaining the allocation gains in this manner, the allocation gain calculation section 71 supplies the overamplitude flags and allocation gain information indicating the obtained allocation gains to the panel output control section 72.

At Step S44, the panel output control section 72 generates output signals for the panel loudspeakers 52 and the sub-woofer 53 on the basis of the channel audio signals supplied from the core signal decoding section 62 and the overamplitude flags and the allocation gain information supplied from the allocation gain calculation section 71.

For a panel loudspeaker 52 for which an overamplitude flag indicating "1" is set, the panel output control section 72 generates an output signal to be supplied to the panel loudspeaker 52 by conducting calculation similar to that indicated by Expression (1), for example.

For a panel loudspeaker 52 for which an overamplitude flag indicating "0" is set and which is decided as an allocation destination of a channel audio signal, the panel output control section 72 generates an output signal to be supplied to the panel loudspeaker 52 by conducting calculation similar to that indicated by Expression (3).

For a panel loudspeaker 52 for which an overamplitude flag indicating "0" is set and which is not decided as an allocation destination of a channel audio signal, the panel output control section 72 simply decides, as an output signal to be supplied to the panel loudspeaker 52, a channel audio signal of the corresponding channel.

Further, in a case where the sub-woofer 53 is decided as an allocation destination of a channel audio signal, the panel output control section 72 generates an output signal therefor by conducting calculation similar to that indicated by Expression (9). In a case where the sub-woofer 53 is not decided as an allocation destination of a channel audio signal, the panel output control section 72 simply decides, as an output signal to be supplied to the sub-woofer 53, a channel audio signal of the corresponding channel.

After obtaining output signals for all the panel loudspeakers 52 and the sub-woofer 53, the panel output control section 72 supplies the respective obtained output signals to the panel loudspeakers 52 and the sub-woofer 53 so that the panel loudspeakers 52 and the sub-woofer 53 reproduce sounds of the respective channels, that is, content sounds.

The content sounds are reproduced in this manner. Then, the decoding process is completed.

As explained so far, the signal processing device 51 obtains allocation gains on the basis of overamplitude flags and channel audio signals, and generates final output signals for the panel loudspeakers 52 and the sub-woofer 53. In other words, the signal processing device 51 adjusts (decides) output signals to be supplied to the panel loudspeakers 52 and the sub-woofer 53, on the basis of overamplitude flags and channel audio signals. Accordingly, high-quality sounds can be reproduced with a low process load.

Second Embodiment

Configuration Example of Encoding-Side Signal Processing Device

Incidentally, in the above embodiment, overamplitude flags are generated at the encoding side, and allocation gains are calculated at the decoding side on the basis of the overamplitude flags. However, calculation of allocation gains may also be conducted at the encoding side. In this case, a process load on the decoding side can be further reduced, and a reproduction delay can be further reduced.

Figure 9:
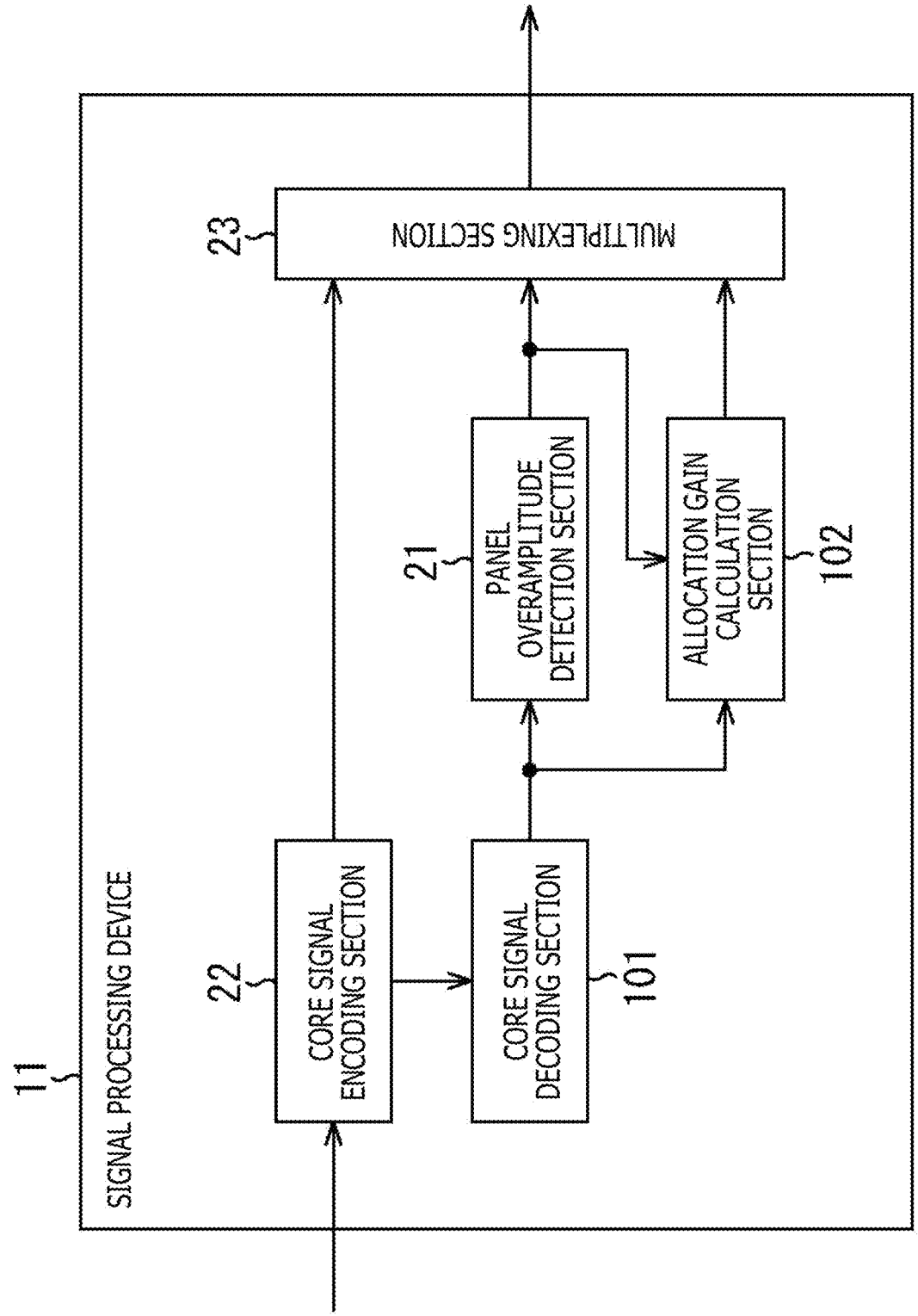
FIG. 9 is a diagram illustrating a configuration example of a signal processing device.

In a case where calculation of allocation gains is conducted at the encoding side, the encoding-side signal processing device 11 has a configuration illustrated in FIG. 9, for example. It is to be noted that, in FIG. 9, a section corresponding to that in FIG. 2 is denoted by the same reference sign, and an explanation thereof will be omitted, as appropriate.

The signal processing device 11 in FIG. 9 includes the panel overamplitude detection section 21, the core signal encoding section 22, a core signal decoding section 101, an allocation gain calculation section 102, and the multiplexing section 23.

The configuration of the signal processing device 11 illustrated in FIG. 9 is different from that of the signal processing device 11 in FIG. 2 in that the core signal decoding section 101 and the allocation gain calculation section 102 are provided in FIG. 9, but is similar to that in FIG. 2, except for this difference.

The core signal decoding section 101 and the allocation gain calculation section 102 correspond to the core signal decoding section 62 and the allocation gain calculation section 71 of the signal processing device 51, respectively.

The core signal decoding section 101 decodes encoded audio signals supplied from the core signal encoding section 22, by a decoding method corresponding to the audio encoding method performed at the core signal encoding section 22, and supplies the resultant decoded audio signals to the panel overamplitude detection section 21 and the allocation gain calculation section 102. The core signal decoding section 101 executes what is called local decoding.

The panel overamplitude detection section 21 generates overamplitude flags on the basis of the decoded audio signals of respective channels supplied from the core signal decoding section 101, and supplies the overamplitude flags to the allocation gain calculation section 102 and the multiplexing section 23.

The allocation gain calculation section 102 generates allocation gain information on the basis of the decoded audio signals supplied from the core signal decoding section 101 and the overamplitude flags supplied from the panel overamplitude detection section 21, and supplies the allocation gain information to the multiplexing section 23.

The multiplexing section 23 generates encoded data by multiplexing the encoded audio signals supplied from the core signal encoding section 22, the overamplitude flags supplied from the panel overamplitude detection section 21, and the allocation gain information supplied from the allocation gain calculation section 102.

Format Example of Encoded Data

In a case where encoded data includes allocation gain information, that is, allocation gains, the encoded data is multiplexed by a format illustrated in FIG. 10, for example.

In the example illustrated in FIG. 10, a character string "audio_encoded_data( )" indicates encoded data of a prescribed frame, and a character string "encoded_channel_data( )" indicates encoded audio signals of one frame obtained by encoding performed by a prescribed audio encoding method.

Further, a character string "Number_of_PanelConfig" indicates the number of preliminarily defined panel structure patterns, and a character string "Num_of_SubPanels[i]" indicates the number of panels (number of panel loudspeakers) constituting the i-th panel structure pattern.

Further, a character string "Panel_Control_Flag[i][k]" indicates an overamplitude flag for the k-th panel loudspeaker in the i-th panel structure. The overamplitude flag is expressed by 1 bit.

In a case where the value of the overamplitude flag "Panel_Control_Flag[i][k]" indicates "1," an allocation gain of an allocation destination panel loudspeaker indicated by a character string "Panel_Gain[p]" and an allocation gain of a sub-woofer indicated by a character string "Panel_Gain_SubWf" are included. Here, each allocation gain is quantized and expressed by 3 bits. It is to be noted that, in this example, an allocation gain of a panel loudspeaker which is not actually decided as an allocation destination panel loudspeaker is also included. Such an allocation gain is set to "0." However, only an allocation gain of a panel loudspeaker which is actually decided as an allocation destination panel loudspeaker may be included.

In the allocation gain "Panel_Gain[p]" of the allocation destination panel loudspeaker, p represents an index (number) for identifying an adjoining panel loudspeaker, that is, an allocation destination panel loudspeaker.

The number of adjoining panel loudspeakers is 8 at most, which include panel loudspeakers disposed adjacent to the upper, lower, left, and right sides of the allocation source panel loudspeaker, and panel loudspeakers obliquely adjacent to the allocation source panel loudspeaker. Therefore, the index p ranges from 0 to 7.

Figures 11, 12:
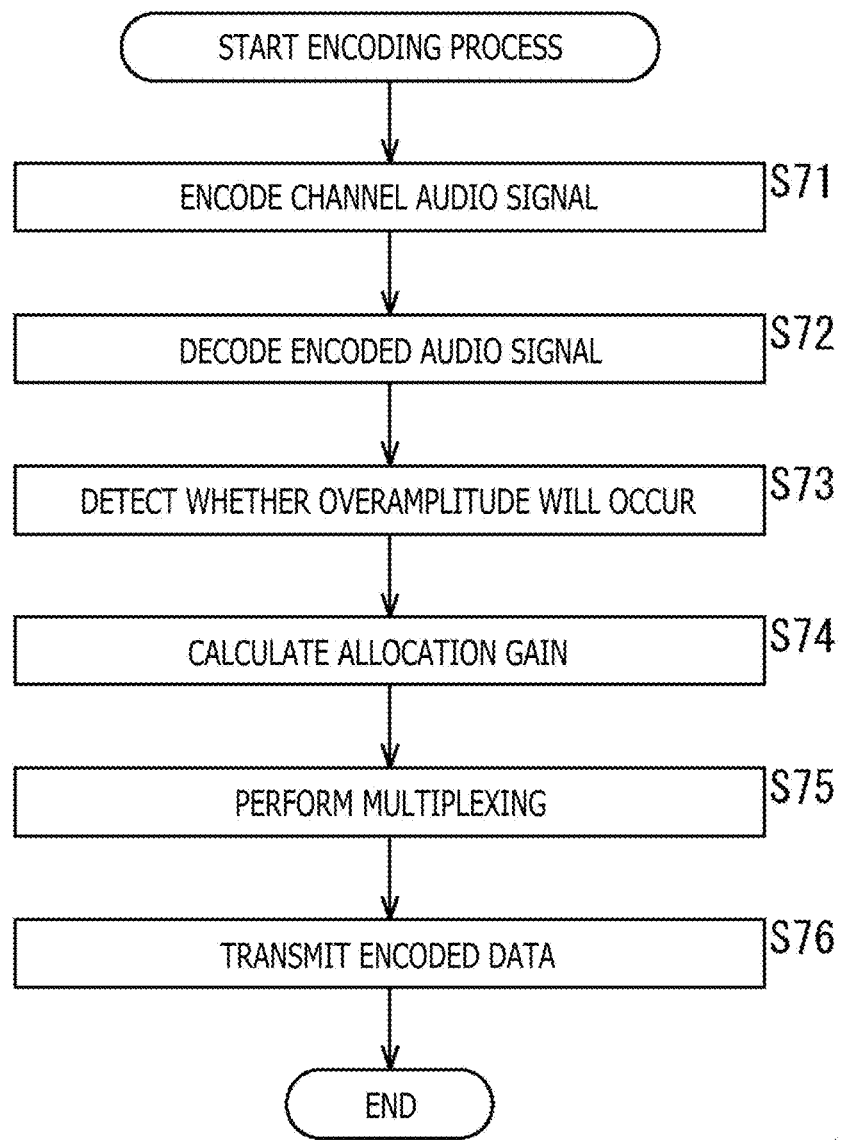
FIG. 11 is a diagram for explaining relative positions of adjoining panel loudspeakers.
FIG. 12 is a flowchart for explaining an encoding process.

The relative position relationship between the allocation source panel loudspeaker and the adjoining panel loudspeaker indicated by each index p is preliminarily determined, as illustrated in FIG. 11, for example.

In the example in FIG. 11, quadrangles each represent a single panel loudspeaker. In particular, a quadrangle disposed on the center in FIG. 11 represents an allocation source panel loudspeaker, and the numerical values indicated in the quadrangles surrounding the center quadrangle each represent the value of the index p.

Therefore, in FIG. 11, the adjoining panel loudspeaker disposed on the lower side of the allocation source panel loudspeaker is indicated by the index p=6, and an adjoining panel loudspeaker disposed on the right side of the allocation source panel loudspeaker is indicated by the index p=4, for example. In FIG. 11, the adjoining panel loudspeaker disposed on the obliquely lower right side of the allocation source panel loudspeaker is indicated by the index p=7, for example.

<Explanation of Encoding Process>

Next, operation of the signal processing device 11 illustrated in FIG. 9 will be explained.

Specifically, an encoding process that is executed by the signal processing device 11 in FIG. 9 will be explained below with reference to a flowchart in FIG. 12.

Figure 4:
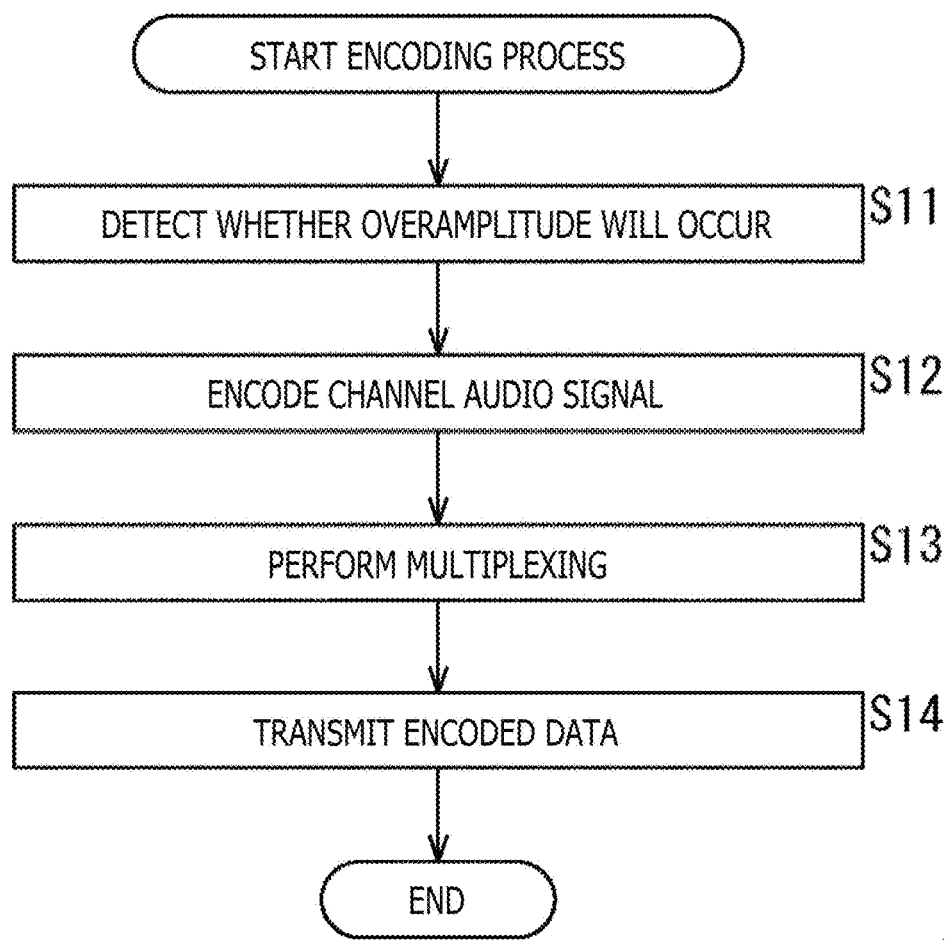
FIG. 4 is a flowchart for explaining an encoding process.

It is to be noted that Step S71 is similar to Step S12 in FIG. 4, and thus, an explanation thereof will be omitted. However, at Step S71, encoded audio signals resulting from encoding are supplied from the core signal encoding section 22 to the multiplexing section 23 and the core signal decoding section 101.

At Step S72, the core signal decoding section 101 decodes the encoded audio signals supplied from the core signal encoding section 22, and supplies the resultant decoded audio signals to the panel overamplitude detection section 21 and the allocation gain calculation section 102.

At Step S73, the panel overamplitude detection section 21 generates overamplitude flags by detecting whether overamplitude will occur, on the basis of the decoded audio signals of the respective channels supplied from the core signal decoding section 101, and supplies the overamplitude flags to the allocation gain calculation section 102 and the multiplexing section 23. It is to be noted that Step S73 is similar to Step S11 in FIG. 4.

At Step S74, the allocation gain calculation section 102 calculates allocation gains on the basis of the decoded audio signals supplied from the core signal decoding section 101 and the overamplitude flags supplied from the panel overamplitude detection section 21, and supplies allocation gain information indicating the calculation results to the multiplexing section 23.

Figure 8:
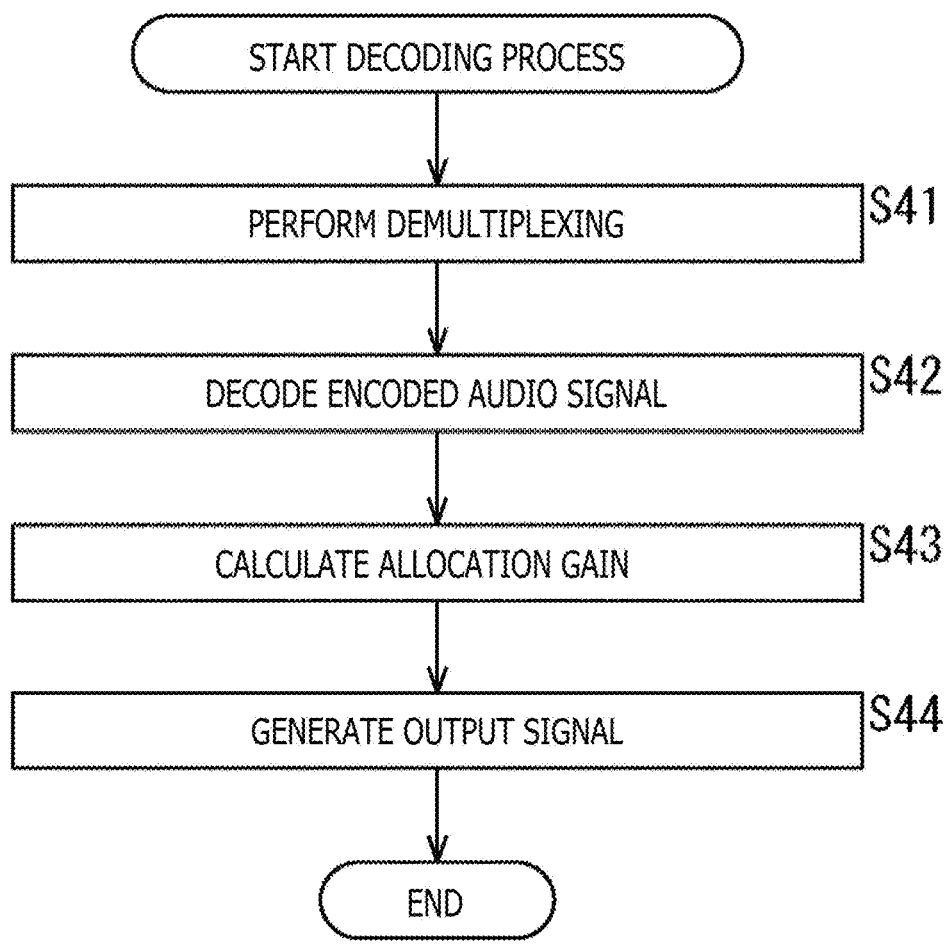
FIG. 8 is a flowchart for explaining a decoding process.

At Step S74 which is similar to Step S43 in FIG. 8, allocation gains of the sub-woofer and allocation destination panel loudspeakers for which overamplitude flags indicating "1" are set are calculated for each panel loudspeaker, in each of the preliminarily defined panel structures.

At Step S75, the multiplexing section 23 generates encoded data by multiplexing the encoded audio signals supplied from the core signal encoding section 22, the overamplitude flags supplied from the panel overamplitude detection section 21, and the allocation gain information supplied from the allocation gain calculation section 102. For example, encoded data according to the format illustrated in FIG. 10 is generated at Step S75.

After the encoded data is generated, the multiplexing section 23 transmits, at Step S76, the encoded data to the decoding-side signal processing device 51. Thus, the encoding process is completed.

As explained so far, the signal processing device 11 generates overamplitude flags and allocation gain information, and generates encoded data by multiplexing the overamplitude flags, the allocation gain information, and encoded audio signals. Accordingly, high-quality sounds can be reproduced while a process load on the decoding side is reduced.

Configuration Example of Decoding-Side Signal Processing Device

Figure 13:
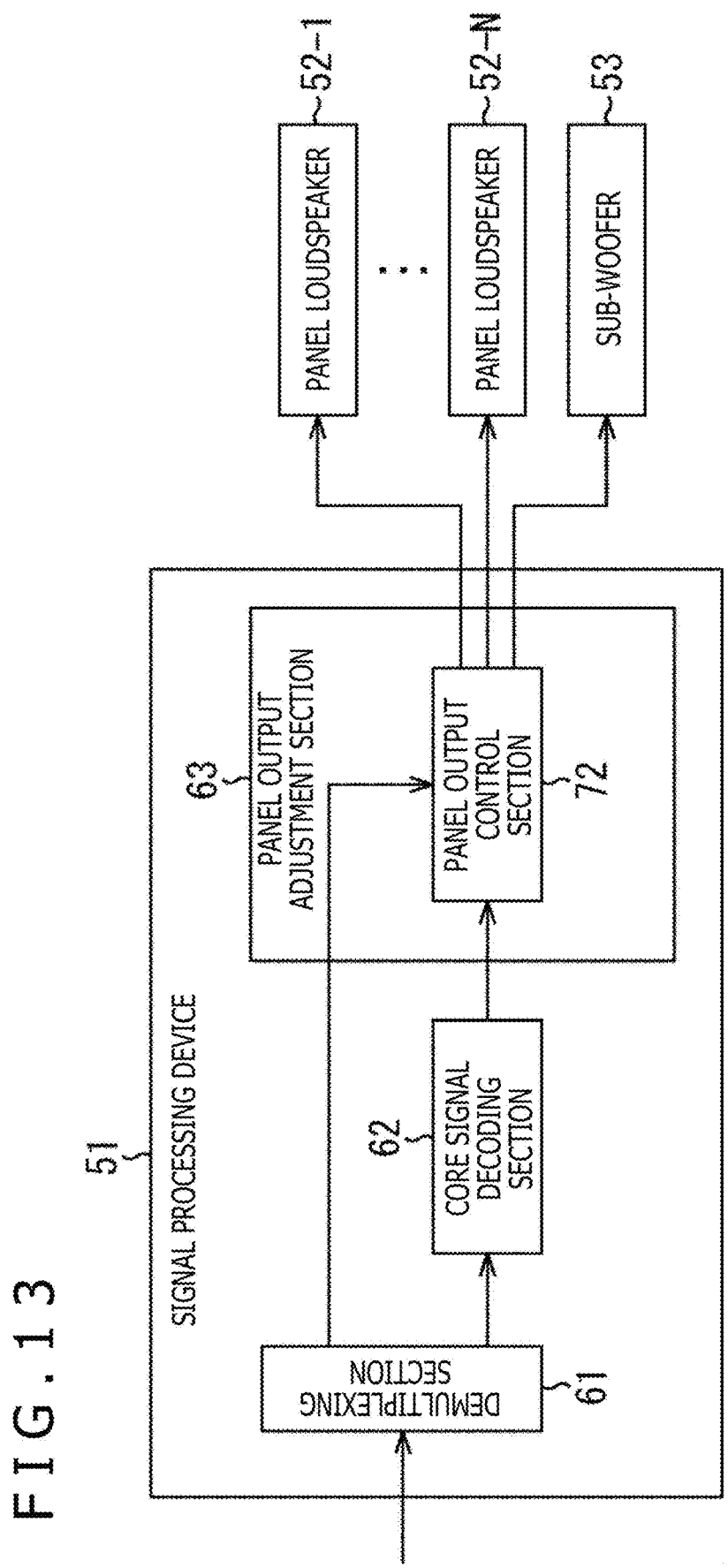
FIG. 13 is a diagram illustrating a configuration example of a signal processing device.

A decoding-side signal processing device that receives and decodes encoded data transmitted from the encoding-side signal processing device 11 illustrated in FIG. 9, has a configuration such as that illustrated in FIG. 13, for example.

It is to be noted that a section in FIG. 13 corresponding to that in FIG. 5 is denoted by the same reference sign, and an explanation thereof will be omitted, as appropriate.

The signal processing device 51 includes the demultiplexing section 61, the core signal decoding section 62, and the panel output adjustment section 63. The panel output adjustment section 63 includes the panel output control section 72.

The configuration of the signal processing device 51 illustrated in FIG. 13 differs from that in FIG. 5 in that the allocation gain calculation section 71 is not provide in the signal processing device 51 illustrated in FIG. 13. Except for this difference, the signal processing device 51 illustrated in FIG. 13 has the same configuration as that in FIG. 5.

In the example in FIG. 13, the demultiplexing section 61 supplies overamplitude flags and allocation gain information that has been extracted from encoded data as a result of demultiplexing, to the panel output control section 72.

On the basis of the overamplitude flags and allocation gain information supplied from the demultiplexing section 61 and channel audio signals supplied from the core signal decoding section 62, the panel output control section 72 adjusts output signals to be supplied to the panel loudspeakers 52 and the sub-woofer 53.

In other words, the panel output control section 72 generates output signals to be supplied to the panel loudspeakers 52 and the sub-woofer 53, on the basis of the overamplitude flags, the allocation gain information, and the channel audio signals.

<Explanation of Decoding Process>

Next, operation of the signal processing device 51 will be explained.

Figure 14:
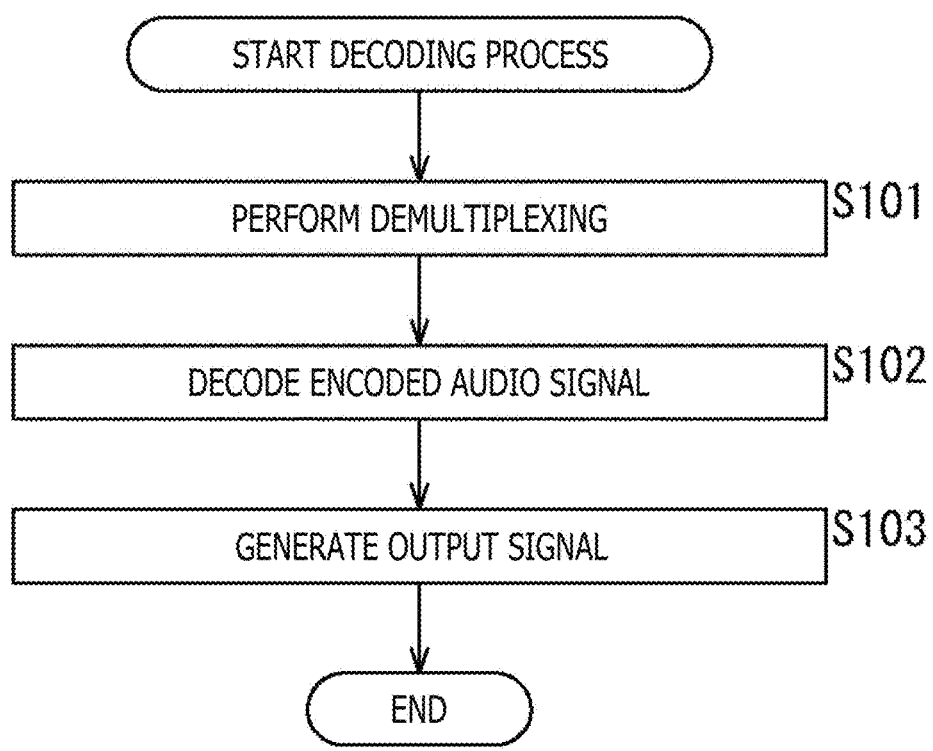
FIG. 14 is a flowchart for explaining a decoding process.

Specifically, a decoding process which is executed by the signal processing device 51 in FIG. 13 will be explained below with reference to the flowchart in FIG. 14.

At Step S101, the demultiplexing section 61 demultiplexes received encoded data, and supplies obtained overamplitude flags and obtained allocation gain information to the panel output control section 72, and further, supplies obtained encoded audio signals to the core signal decoding section 62.

At Step S102, the core signal decoding section 62 decodes the encoded audio signals supplied from the demultiplexing section 61, and supplies the resultant channel audio signals to the panel output control section 72.

At Step S103, the panel output control section 72 generates output signals on the basis of the overamplitude flags and the allocation gain information supplied from the demultiplexing section 61, and the channel audio signals supplied from the core signal decoding section 62.

It is to be noted that Step S103 which is similar to Step S44 in FIG. 8 is executed so that output signals to be supplied to the panel loudspeakers 52 and the sub-woofer 53 are generated.

After the output signals are thus generated, the panel output control section 72 supplies the output signals to the panel loudspeakers 52 and the sub-woofer 53 such that the panel loudspeakers 52 and the sub-woofer 53 reproduce content sounds. Thus, the decoding process is completed.

As explained so far, the signal processing device 51 generates output signals to be supplied to the panel loudspeakers 52 and the sub-woofer 53, on the basis of overamplitude flags and allocation gain information. Accordingly, high-quality sounds can be reproduced with a low process load.

According to the above-mentioned first embodiment and the above-mentioned second embodiment, a part of an output is allocated to adjoining panel loudspeakers. Accordingly, even under a condition where normal reproduction would cause overamplitude in panel loudspeakers of a panel loudspeaker system, high-quality sounds can be reproduced without involving degradation of the sound pressure level or degradation of the sound image impression.

Moreover, while a resource load (process load) and a process delay in the signal processing device 51 which is the decoding-side (reproduction-side) terminal device are not increased, channel audio signals can be allocated to adjoining panel loudspeakers according to the panel structure. Accordingly, high-quality sounds can be reproduced with a small process amount (low process load) and a reduced process delay.

Third Embodiment

Configuration Example of Encoding-Side Signal Processing Device

Meanwhile, what is called an encoding method and a rendering method of object audio using an object sound source, that is, an audio object (hereinafter, simply referred to as object), such as MPEG (Moving Picture Experts Group)-H 3D Audio (ISO/IEC 23008-3), have been recently developed.

Object sound source restoration information is transferred as metadata which is called OAM (Object Audio Metadata), and, at the time of reproduction, an object is rendered on the basis of object position information written in the OAM. Thus, a sound is reproduced.

However, in a case where an object audio is reproduced by a panel loudspeaker system, occurrence of overamplitude in a panel loudspeaker degrades the sound image impression of the object positioned in a panel of the panel loudspeaker.

In particular, in a case where an object is moving, if the object is located on a panel loudspeaker in which overamplitude occurs, the sound of the object is not reproduced at the overamplitude timing, or the sound image position of the sound of the object is displaced. Thus, the reproduction quality may be greatly degraded.

To this end, a part of an object signal for reproducing an object sound is allocated to adjoining panel loudspeakers, as in the first embodiment or the second embodiment, for example. If so, degradation of the sound image impression can be suppressed with a low process load, and high-quality sounds can be reproduced.

Moreover, allocation of object signals is conducted in view of whether or not an object is moving or the movement direction of the object. If so, degradation in the sound image impression can be further suppressed.

Hereinafter, an embodiment to which the present technology is applied for reproduction of object audio, will be explained.

Figure 15:
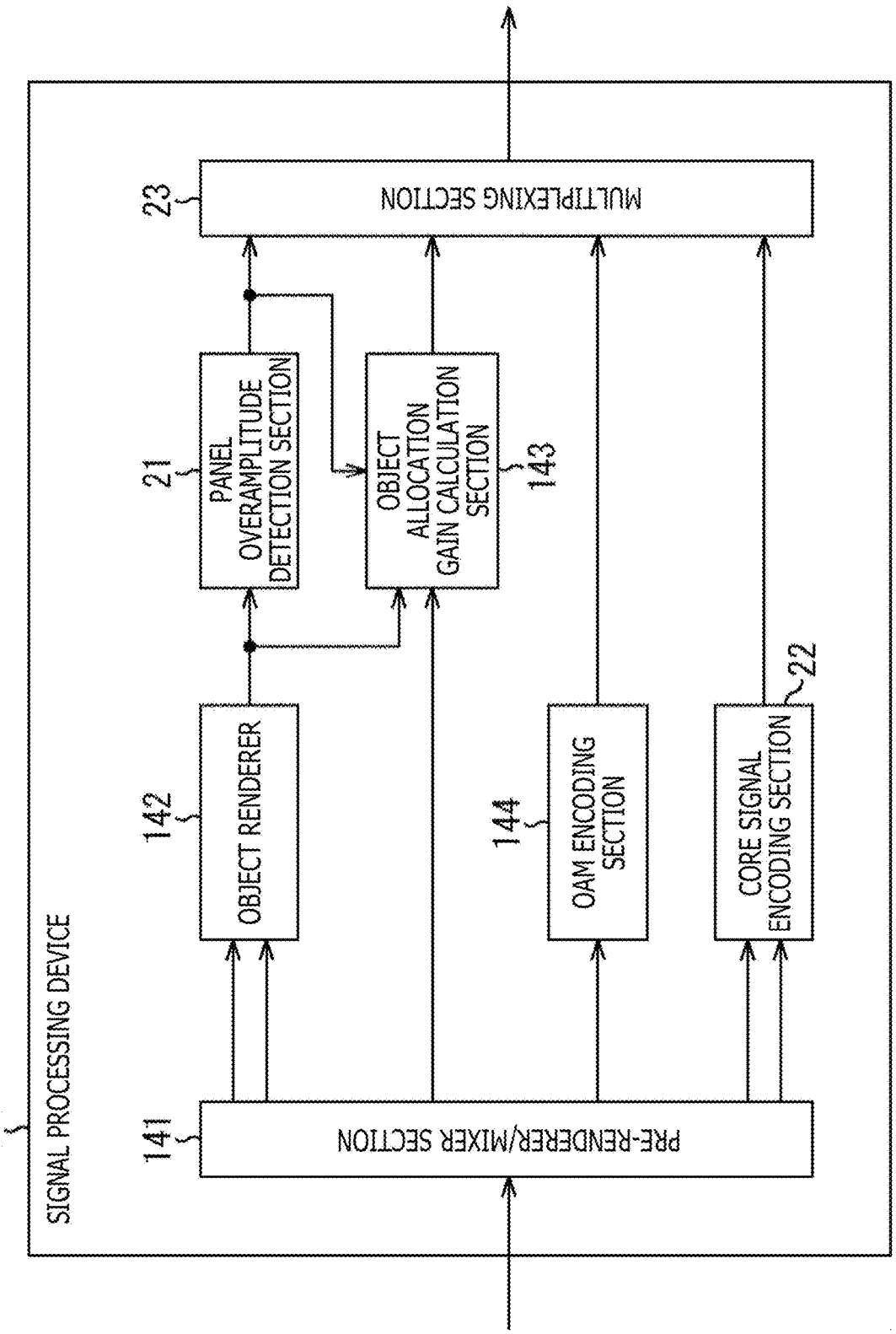
FIG. 15 is a diagram illustrating a configuration example of a signal processing device.

FIG. 15 is a diagram illustrating a configuration example of an encoding-side signal processing device to which the present technology is applied. It is to be noted that, a section in FIG. 15 corresponding to that in FIG. 2 is denoted by the same reference sign, and an explanation thereof will be omitted, as appropriate.

A signal processing device 131 in FIG. 15 functions as an encoding device that receives an input of channel audio signals of channels and an input of object signals for reproducing object sounds as data on content sound, for example, and encodes the object signals and the channel audio signals.

The signal processing device 131 includes a pre-renderer/mixer section 141, an object renderer 142, the panel overamplitude detection section 21, an object allocation gain calculation section 143, an OAM encoding section 144, the core signal encoding section 22, and the multiplexing section 23.

Object signals and OAM (object audio metadata) of respective objects, channel audio signals of respective channels, and a pre-rendering level are supplied to the pre-renderer/mixer section 141.

The OAM is metadata on an object. The OAM at least includes position information indicating a position where the object is disposed in a three-dimensional space, and priority-level information indicating the priority level of the object.

The pre-rendering level is information indicating the number of objects to be pre-rendered by the encoding side. For example, any one of Lev-1, Lev-2, and Lev-3 is specified as the pre-rendering level.

Here, Lev-1, Lev-2, and Lev-3 are specified in the descending order of the number of objects to be pre-rendered. That is, in a case where Lev-1 is specified as a pre-rendering level, the pre-rendering level indicates that the number of objects to be pre-rendered is largest. It is to be noted that a method for specifying the pre-rendering level is not limited to this, and any method can be adopted.

In a case where the number of objects constituting content is large, if all the objects are rendered by the decoding side (reproduction side), a process amount at the decoding side becomes large.

To this end, the pre-renderer/mixer section 141 performs rendering (pre-rendering) at the encoding side, on objects with low priority levels among objects constituting content.

Specifically, on the basis of the OAM on the objects with low priority levels, the pre-renderer/mixer section 141 maps object signals of the objects with low priority levels onto channel audio signals of the channels, thereby generates post-pre-rendering channel audio signals.

The post-pre-rendering channel audio signal of each channel obtained by the above pre-rendering is an audio signal for reproducing a sound of the channel and a sound of the corresponding pre-rendered object.

In particular, in a case where sounds are reproduced on the basis of the post-pre-rendering channel audio signals, the sound image of each object sound is localized at a position indicated by position information included in the OAM on the object.

It is to be noted that, from among a plurality of objects, the pre-renderer/mixer section 141 selects objects in the ascending order of the priority level indicated by the priority information such that the number of the selected objects is determined by the pre-rendering level. The selected objects are objects decided to be pre-rendered. In addition, from among the plurality of objects, objects that have not been selected as a pre-rendering target, that is, the remaining objects are non-pre-rendering target objects.

Hereinafter, objects decided not to be pre-rendered are also referred to as non-target objects, while objects decided to be pre-rendered are also referred to as target objects.

After selecting target objects on the basis of the pre-rendering levels and the OAM, the pre-renderer/mixer section 141 generates post-pre-rendering channel audio signals by performing pre-rendering on the basis of OAM and the object signals of the target objects, and the channel audio signals of the respective channels. Here, for example, VBAP (Vector Based Amplitude Panning) or the like is performed as the pre-rendering.

The pre-renderer/mixer section 141 supplies the post-pre-rendering channel audio signals, the object signals of the non-target objects, and the OAM on the non-target objects to the object renderer 142.

Further, the pre-renderer/mixer section 141 supplies the OAM on the non-target objects to the object allocation gain calculation section 143 and the OAM encoding section 144.

Further, the pre-renderer/mixer section 141 supplies the post-pre-rendering channel audio signals resulting from the pre-rendering and the object signals of the non-target objects to the core signal encoding section 22.

The object renderer 142 renders the non-target objects on the basis of the post-pre-rendering channel audio signals, the OAM on the non-target objects, and the object signals of the non-target objects supplied from the pre-renderer/mixer section 141.

Specifically, the object renderer 142 generates a combined channel signal of each channel by mapping the object signals of the non-target objects onto the post-pre-rendering channel audio signals on the basis of the OAM.

For example, the object renderer 142 performs VBAP or the like as the rendering process. Thus, signals for reproducing sounds of the non-target objects in the same channel structure as the post-pre-rendering channel audio signals, are generated. Further, the signal for reproducing the sound of each non-target object and a signal of the same channel as the post-pre-rendering channel audio signal are added together to form a combined channel signal.

When sounds are reproduced on the basis of the combined channel signals of the respective channels, sounds based on the channel audio signals, sounds of the target objects, and sounds of the non-target objects are reproduced.

In particular, in a case where sounds are reproduced on the basis of the combined channel signals, sound images of the sounds of the non-target objects are localized at respective positions indicated by the position information included in the OAM on the non-target objects.

The object renderer 142 supplies the combined channel signals of the respective channels resulting from the rendering, to the panel overamplitude detection section 21 and the object allocation gain calculation section 143.

The panel overamplitude detection section 21 generates overamplitude flags for the respective panel loudspeakers in each panel structure, on the basis of the combined channel signals supplied from the object renderer 142, and supplies the overamplitude flags to the object allocation gain calculation section 143 and the multiplexing section 23.

The object allocation gain calculation section 143 generates allocation gain information on the basis of the OAM supplied from the pre-renderer/mixer section 141, the combined channel signals supplied from the object renderer 142, and the overamplitude flags supplied from the panel overamplitude detection section 21, and supplies the allocation gain information to the multiplexing section 23.

The OAM encoding section 144 encodes the OAM on the non-target objects supplied from the pre-renderer/mixer section 141, and supplies the resultant encoded OAM to the multiplexing section 23.

The core signal encoding section 22 encodes the object signals of the non-target objects and the post-pre-rendering channel audio signals supplied from the pre-renderer/mixer section 141, by a prescribed audio encoding method, and supplies the resultant encoded audio signals to the multiplexing section 23.

The multiplexing section 23 multiplexes the overamplitude flags supplied from the panel overamplitude detection section 21, the allocation gain information supplied from the object allocation gain calculation section 143, the encoded OAM supplied from the OAM encoding section 144, and the encoded audio signals supplied from the core signal encoding section 22, by a prescribed format, and transmits the resultant encoded data to the decoding-side device.

<Calculation of Allocation Gain>

Here, a specific example in which the object allocation gain calculation section 143 calculates an allocation gain, will be explained.

OAM on an object (non-target object) in each of temporally successive frames is supplied to the object allocation gain calculation section 143.

Therefore, the object allocation gain calculation section 143 can determine, from position information included in the OAM in each time point or each frame, whether or not the object is positioned in any of the panels of panel loudspeakers included in each panel structure, or whether or not the object is moving.

For example, it is assumed that, in a certain panel structure, the nine panel loudspeakers P0 to P8 constitute one display panel, as illustrated in FIG. 16. It is to be noted that each rectangle in FIG. 16 represents a single panel loudspeaker.

It is assumed that, as indicated by an arrow Q31, an object OB11 positioned in the panel of the panel loudspeaker P0 is moving toward a direction of an arrow A11, that is, a direction to the panel loudspeaker P4.

It is to be noted that the moving direction of the object OB11 can be predicted with reference to the OAM on the object OB11 in the current frame and that in a past frame. In addition, if data prefetching is possible, movement of the object OB11 can be more precisely determined with reference to the OAM on the object OB11 in a future frame.

In such a state, it is assumed that, because overamplitude will occur in the panel loudspeaker P0, a part of a combined channel signal including a sound of the object OB11, to be supplied to the panel loudspeaker P0 is allocated to adjoining panel loudspeakers. Whether or not the combined channel signal to be supplied to the panel loudspeaker P0 includes the sound of the object OB11, can be determined from position information included in the OAM on the object OB11.

In such a case, if a plurality of the adjoining panel loudspeakers P3, P4, and P1 adjoining to the panel loudspeaker P0 is selected as allocation destinations, the sound image of the object OB11 is divided to a plurality of positions. Accordingly, the image sound is extended. Thus, localization impression (sound image impression) of the sound image becomes vague.

To this end, in a case where the object OB11 is moving, for example, the combined channel signal is only required to be allocated to only the panel loudspeaker P4 toward which the object OB11 is moving. That is, the panel loudspeaker P4 is decided as an allocation destination on the basis of the movement direction of the object OB11.

It is to be noted that, in this case, the allocation gain of the panel loudspeaker P4 can be obtained by calculation similar to that indicated by Expression (5), for example.

However, in this case, calculation indicated by Expression (5) may be conducted on condition that there is only one panel loudspeaker to which allocation can be performed, that is, an adjoining panel loudspeaker belonging to the set S is the panel loudspeaker P4 alone.

Further, in a case where the allocation gain $\alpha_i$ of the panel loudspeaker P4 obtained by calculation similar to that indicated by Expression (5) is greater than the maximum value $\alpha_i^{MAX}$, the maximum value $\alpha_i^{MAX}$ is substituted for the allocation gain $\alpha_i$ as indicated by Expression (7). A part, of the sound pressure level, exceeding the maximum value $\alpha_i^{MAX}$ is allocated to the sub-woofer 53.

In contrast, it is assumed that the object OB11 positioned in the panel of the panel loudspeaker P0 stays motionless, as indicated by an arrow Q32.

In a case where overamplitude will occur in the panel loudspeaker P0, only a panel loudspeaker, among adjoining panel loudspeakers for which overamplitude flags indicating "0" are set, positioned closest to the position of the object OB11 is decided as an allocation destination panel loudspeaker.

In this example, therefore, the panel loudspeaker P3 positioned closest to the object OB11 is decided (selected) as an allocation destination panel loudspeaker.

It is to be noted that, in a case where a plurality of objects is positioned in the panel of a panel loudspeaker in which occurrence of an overamplitude is expected, an allocation destination panel loudspeaker is only required to be decided on the basis of the position and the movement direction of the object with the highest priority level among the plurality of objects.

Format Example of Encoded Data

Further, encoded data obtained by the multiplexing section 23 of the signal processing device 131 includes encoded audio data illustrated in FIG. 17 and encoded OAM illustrated in FIG. 18, for example.

In FIG. 17, a character string "audio_encoded_data( )" indicates the encoded audio data, and the encoded audio data in each frame is transferred to the decoding side, for example.

In this example, the encoded audio data "audio_encoded_data( )" has a format for multiplexing an encoded audio signal, an overamplitude flag, and allocation gain information. This format is substantially identical to that illustrated in FIG. 10.

That is, in FIG. 17, the character string "encoded_channel_data( )" indicates an encoded audio signal of one frame, and a character string "Number_of_PanelConfig" indicates the number of preliminarily defined pattern structures.

Further, a character string "Num_of_SubPanels[i]" indicates the number of panels (number of panel loudspeakers) constituting the i-th panel structure. A character string "Panel_Control_Flag[i][k]" indicates overamplitude flag set for the k-th panel loudspeaker of the i-th panel structure.

Further, in this example, in a case where an object is positioned in the panel of the allocation source panel loudspeaker, information indicating the relative position of a single allocation destination panel loudspeaker and the allocation gain of the allocation destination panel loudspeaker are transferred. Thus, the efficiency of transferring the allocation gain information is increased.

Specifically, a character string "object_exist" indicates an object presence flag indicating the presence/absence of an object in the panel of the k-th panel loudspeaker of the i-th panel structure.

The object presence flag "object_exist" is stored in this data in a case where the overamplitude flag "Panel_Control_Flag[i][k]" indicates "1," that is, in a case where the corresponding panel loudspeaker is an allocation source panel loudspeaker.

In addition, in a case where the value of the object presence flag "object_exist" indicates "1," that is, in a case where an object is present in the panel of the allocation source panel loudspeaker, a number (index) indicating the relative position of the allocation destination panel loudspeaker indicated by a character string "Panel_relative_id" and an allocation gain indicated by a character string "Panel_Gain" are further included.

For example, the number "Panel_relative_id," which indicates the relative position, is the above-mentioned index p expressed by 3 bits. Also, the allocation gain "Panel_Gain" is also quantized and expressed by 3 bits.

In contrast, in a case where the value of the object presence flag "object_exist" indicates "0," that is, in a case where no object is present in the panel of the allocation source panel loudspeaker, the allocation gain of the allocation destination panel loudspeaker indicated by a character string "Panel_Gain[p]" is stored, as in the case illustrated in FIG. 10.

In addition, in a case where the overamplitude flag "Panel_Control_Flag[i][k]" indicates "1," the allocation gain of the sub-woofer indicated by a character string "Panel_Gain_SubWf" is further stored, if needed.

The encoded OAM illustrated in FIG. 18 is transferred at every prescribed object processing time period such as one frame or a unit of a few frames.

In the example in FIG. 18, a character string "object_matadata( )" indicates object sound source metadata in a prescribed time section such as one frame in the encoded data. This metadata is encoded OAM.

In addition, the encoded OAM includes an index for identifying an object indicated by a character string "object index."

The encoded OAM further includes an azimuth angle "position_azimuth" indicating the position of the object, an elevation angle "position_elevation" indicating the position of the object, and a radius "position_radius" indicating the position of the object.

The encoded OAM further includes a gain "gain_factor" for performing gain correction on the object, priority level information "dynamic_object_prority" indicating the priority level of the object for rendering etc.

<Explanation of Encoding Process>

Next, operation of the signal processing device 131 will be explained.

Specifically, an encoding process which is executed by the signal processing device 131 will be explained below with reference to a flowchart in FIG. 19.

At Step S131, the pre-renderer/mixer section 141 performs pre-rendering.

Specifically, the pre-renderer/mixer section 141 selects target objects to be pre-rendered, on the basis of supplied pre-rendering levels and OAM on objects.

Then, the pre-renderer/mixer section 141 performs VBAP or the like on the basis of supplied object signals of the target objects and OAM on the target objects and supplied channel audio signals of respective channels, and thus generates post-pre-rendering channel audio signals of the respective channels.

The pre-renderer/mixer section 141 supplies the post-pre-rendering channel audio signals of the respective channels, and the supplied object signals of non-target objects and OAM on the non-target objects to the object renderer 142.

Further, the pre-renderer/mixer section 141 supplies the OAM on the non-target object to the object allocation gain calculation section 143 and the OAM encoding section 144, and supplies the post-pre-rendering channel audio signals and the object signals of the non-target objects to the core signal encoding section 22.

At Step S132, the object renderer 142 renders the non-target objects on the basis of the post-pre-rendering channel audio signals of the respective channels and the object signals of the non-target objects and the OAM thereon supplied from the pre-renderer/mixer section 141. For example, at Step S132, VBAP or the like is performed as the rendering. Thus, combined channel signals of the respective channels are generated.

The object renderer 142 supplies the combined channel signals of the respective channels resulting from the rendering, to the panel overamplitude detection section 21 and the object allocation gain calculation section 143.

At Step S133, the panel overamplitude detection section 21 generates overamplitude flags for respective panel loudspeakers in each of the panel structures, on the basis of the combined channel signals supplied from the object renderer 142, and supplies the overamplitude flags to the object allocation gain calculation section 143 and the multiplexing section 23. For example, Step S133 which is similar to Step S11 in FIG. 4 is executed to detect overamplitude and generate overamplitude flags.

At Step S134, the object allocation gain calculation section 143 executes an allocation gain calculating process on the basis of the OAM supplied from the pre-renderer/mixer section 141, the combined channel signals supplied from the object renderer 142, and the overamplitude flags supplied from the panel overamplitude detection section 21.

It is to be noted that, in the allocation gain calculating process the details of which will be explained later, allocation gains are calculated in each of the panel structures so that allocation gain information is generated.

The object allocation gain calculation section 143 supplies the allocation gain information obtained as a result of the allocation gain calculating process, to the multiplexing section 23.

At Step S135, the OAM encoding section 144 encodes the OAM on the non-target objects supplied from the pre-renderer/mixer section 141, and supplies the resultant encoded OAM to the multiplexing section 23.

At Step S136, the core signal encoding section 22 encodes the object signals of the non-target objects and the post-pre-rendering channel audio signals supplied from the pre-renderer/mixer section 141, and supplies the resultant encoded audio signals to the multiplexing section 23.

At Step S137, the multiplexing section 23 generates encoded data by multiplexing the overamplitude flags supplied from the panel overamplitude detection section 21, the allocation gain information supplied from the object allocation gain calculation section 143, the encoded OAM supplied from the OAM encoding section 144, and the encoded audio signals supplied from the core signal encoding section 22. Here, the encoded data is generated by the formats illustrated in FIG. 17 and FIG. 18, for example.

At Step S138, the multiplexing section 23 transmits the encoded data to the decoding-side device. Thus, the encoding process is completed.

As explained so far, the signal processing device 131 generates overamplitude flags and allocation gain information, and generates encoded data by multiplexing the overamplitude flags, the allocation gain information, and encoded audio signals. Accordingly, high-quality sounds can be reproduced while a process load on the decoding side is suppressed.

<Explanation of Allocation Gain Calculating Process>

The allocation gain calculating process at Step S134 in FIG. 19, which is executed by the signal processing device 131, will be explained with reference to a flowchart in FIG. 20. It is to be noted that the allocation gain calculating process is executed for each of a preliminarily defined panel structures.

At Step S171, the object allocation gain calculation section 143 selects, from among a plurality of panel loudspeakers in a panel structure being processed, one panel loudspeaker to be processed as a target panel loudspeaker.

At Step S172, the object allocation gain calculation section 143 determines whether or not overamplitude will occur in the target panel loudspeaker, on the basis of the overamplitude flag set for the target panel loudspeaker supplied from the panel overamplitude detection section 21.

In a case where it is determined at Step S172 that no overamplitude will occur, that is, in a case where the overamplitude flag indicates "0," allocation of an output to the target panel loudspeaker is unnecessary. Then, the process proceeds to Step S180.

On the other hand, in a case where it is determined at Step S172 that overamplitude will occur, that is, in a case where the overamplitude flag indicates "1," the object allocation gain calculation section 143 determines, at Step S173, whether or not any object is present in the panel of the target panel loudspeaker.

For example, on the basis of the OAM on the non-target objects supplied from the pre-renderer/mixer section 141, the object allocation gain calculation section 143 makes the determination by determining whether each of the non-target objects is positioned in the panel of the target panel loudspeaker.

In a case where it is determined at Step S173 that no object is present, the process proceeds to Step S174.

At Step S174, from among the adjoining panel loudspeakers adjoining to the target panel loudspeaker, the object allocation gain calculation section 143 selects, as an allocation destination panel loudspeaker, an adjoining panel loudspeaker in which no overamplitude will occur, that is, for which the overamplitude flag indicating "0" is set, on the basis of the overamplitude flags set for the adjoining panel loudspeakers.

In this case, at Step S179 to be explained later where allocation gains are calculated, a sound pressure level is allocated to one or a plurality of adjoining panel loudspeakers in which no overamplitude will occur, in proportion to an allowance in each of the adjoining panel loudspeakers to the upper limit of the amplitude value.

After the allocation destination panel loudspeakers are selected (decided) in this manner, the process proceeds to Step S179.

On the other hand, in a case where it is determined at Step S173 that any object is disposed in the panel of the target panel loudspeaker, the process proceeds to Step S175.

At Step S175, the object allocation gain calculation section 143 selects a non-target object with the highest priority level from among the non-target objects positioned in the panel of the target panel loudspeaker, on the basis of the OAM on the non-target objects supplied from the pre-renderer/mixer section 141. This selection is made on the basis of the priority level information "dynamic_object_priority" illustrated in FIG. 18, for example.

It is to be noted that, hereinafter, the non-target object with the highest priority level selected at Step S175 is also referred to as a selected object.

At Step S176, the object allocation gain calculation section 143 determines whether or not the selected object is moving, on the basis of the OAM on the selected object.

Here, the presence/absence of movement (motion) of the selected object and the movement direction is identified on the basis of the OAM on the selected object in a plurality of frames such as the current frame and a past frame, for example, so that whether or not the selected object is moving is determined.

For example, the presence/absence of movement of the selected object and the movement direction can be identified on the basis of the difference in the position of the selected object between different time points (frames). Further, if a process delay in the signal processing device 131 is allowable, the OAM in, for example, the current frame and the next frame which is a future frame may be used to identify the movement and the movement direction.

In a case where it is determined at Step S176 that the selection object is moving, the process then proceeds to Step S177.

At Step S177, the object allocation gain calculation section 143 selects, as an allocation destination panel loudspeaker, an adjoining panel loudspeaker toward which the selected object is moving, on the basis of the movement direction of the selected object. After Step S177, the process proceeds to Step S179.

On the other hand, in a case where it is determined at Step S176 that the selected object is not moving and stays motionless, the process then proceeds to Step S178.

At Step S178, the object allocation gain calculation section 143 selects, as an allocation destination panel loudspeaker, an adjoining panel loudspeaker positioned closest to the selected object from among the adjoining panel loudspeakers adjoining to the target panel loudspeaker on the basis of the position of the selected object. After Step S178, the process then proceeds to Step S179.

Step S179 is executed after Step S174, Step S177, or Step S178.

At Step S179, the object allocation gain calculation section 143 calculates an allocation gain of the allocation destination panel loudspeaker selected as the allocation destination.

For example, Step S179 which is similar to Step S43 in FIG. 8 is executed to calculate not only the allocation gain of the allocation destination loudspeaker but also the allocation gain of the allocation source panel loudspeaker. If allocation to the sub-woofer is to be conducted, the allocation gain of the sub-woofer is also calculated.

It is to be noted that, in a case where Step S177 and Step S178 are executed, for example, the number of allocation destination panel loudspeakers is one. Even in this case, calculation similar to that indicated by Expression (5) and Expression (8) is conducted on condition that the number of adjoining panel loudspeaker belonging to the set S is one. Accordingly, the allocation gain thereof can be obtained.

In a case where Step S179 is executed or it is determined at Step S172 that no overamplitude will occur, the object allocation gain calculation section 143 determines, at Step S180, whether or not the process has been executed on all the panel loudspeakers.

For example, in a case where Step S172 to Step S179 have been executed on all the panel loudspeakers as target panel loudspeakers, it is determined at Step S180 that the process has been executed on all the panel loudspeakers.

In a case where it is determined, at Step S180, that the process has not been executed on all the panel loudspeakers, the process returns to Step S171, and then, the above-mentioned steps are repeated.

In contrast, in a case where it is determined, at Step S180, that the process has been executed on all the panel loudspeakers, the object allocation gain calculation section 143 supplies the allocation gain information indicating the allocation gains obtained by steps S171 to S180, to the multiplexing section 23. Then, the allocation gain calculating process is completed.

Figure 19:
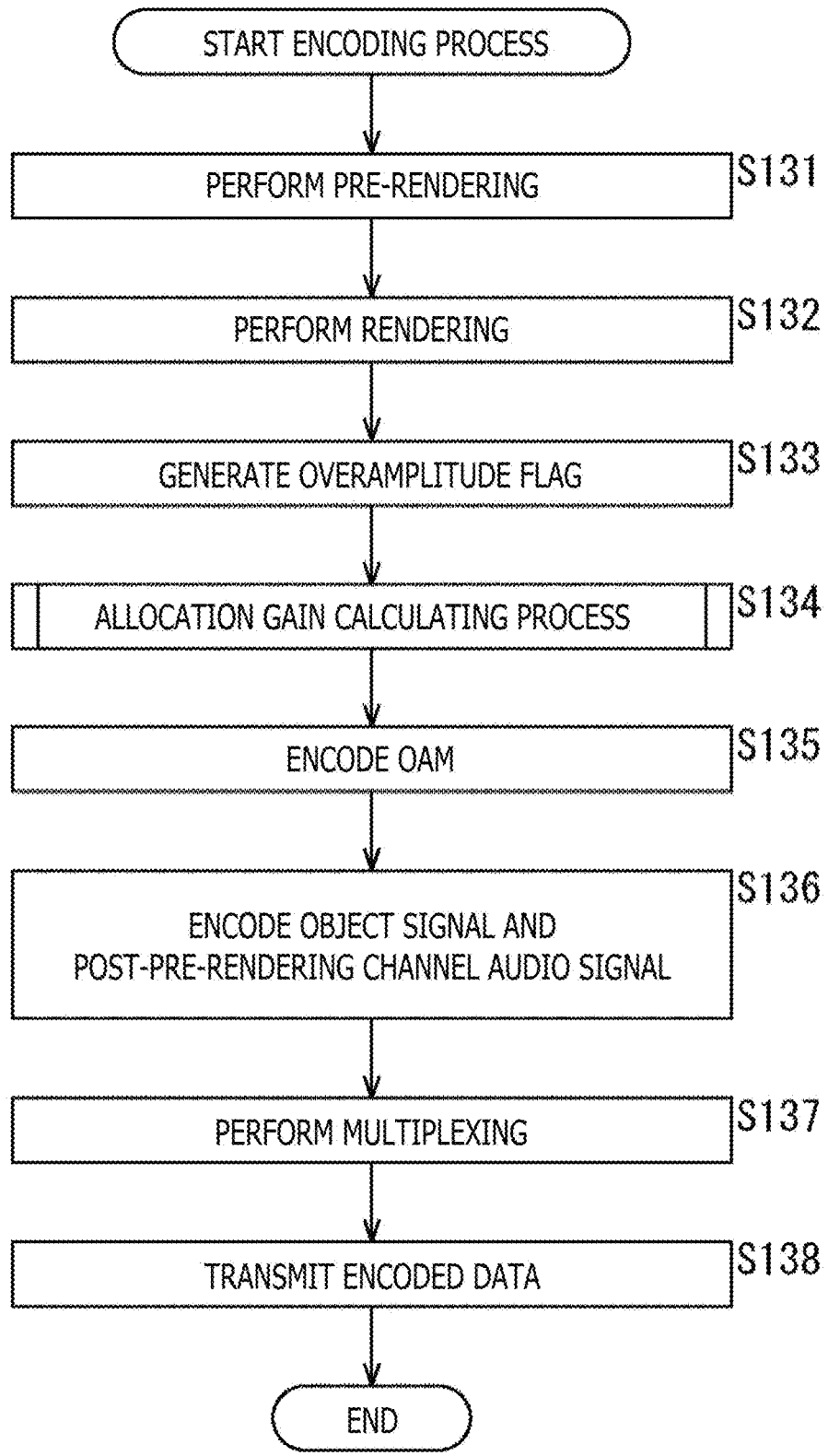
FIG. 19 is a flowchart for explaining an encoding process.
Figure 20:
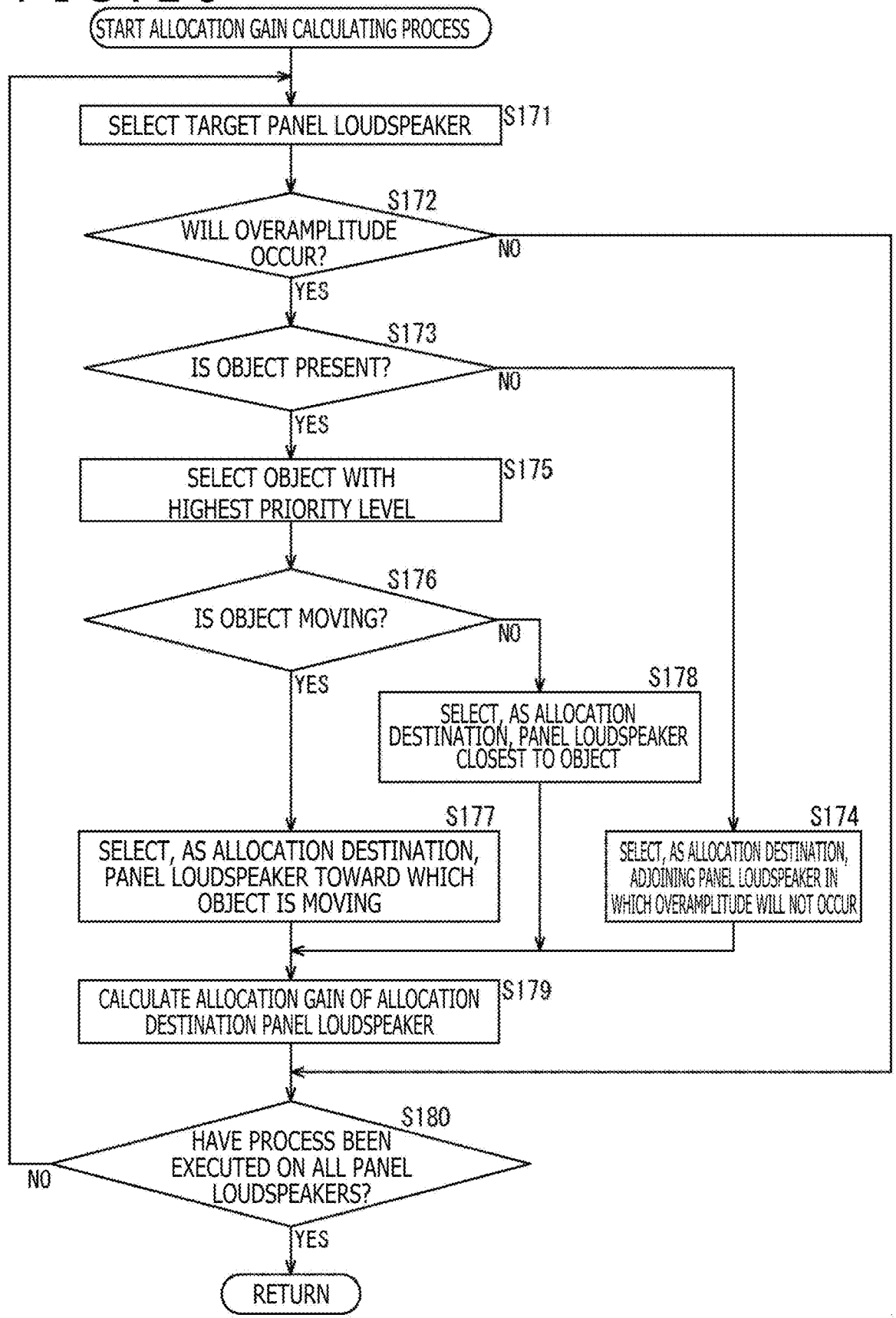
FIG. 20 is a flowchart for explaining an allocation gain calculating process.

When the allocation gain calculating process is completed, Step S134 in FIG. 19 is completed. Thereafter, the process proceeds to Step S135 in FIG. 19.

In the above-mentioned manner, the signal processing device 131 selects allocation destination panel loudspeakers on the basis of the presence/absence of an object in a panel of a target panel loudspeaker, the presence/absence of movement of the object, and the movement direction of the object, and calculates the allocation gain.

As a result, a sound pressure level can be allocated to more proper adjoining panel loudspeakers so that sounds can be reproduced while higher sound image impression is provided. That is, high-quality sounds can be reproduced.

It is to be noted that, in a case where it is still expected that overamplitude will occur in the panel loudspeakers after the above-mentioned allocation gain calculating process is executed, an object with the second-highest priority level, for example, may be defined as a selected object, and steps S176 to S179 may be further executed. Accordingly, allocation to a plurality of allocation destination panel loudspeakers is conducted so that occurrence of overamplitude can be prevented.

Configuration Example of Decoding-Side Signal Processing Device

Next, an explanation will be given below of a decoding-side signal processing device that receives and decodes encoded data transmitted from the encoding-side signal processing device 131.

Figure 21:
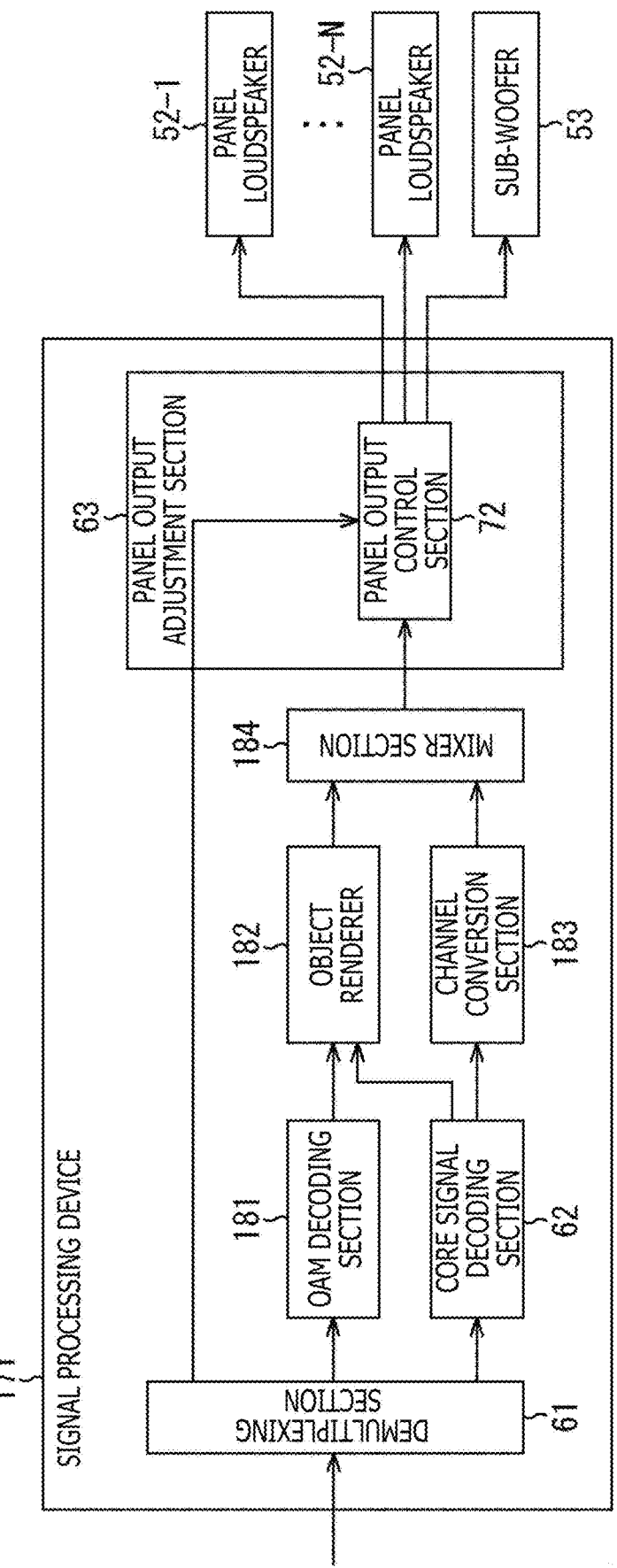
FIG. 21 is a diagram illustrating a configuration example of a signal processing device.

A decoding-side signal processing device of this type has a configuration illustrated in FIG. 21, for example. It is to be noted that a section in FIG. 21 corresponding to that in FIG. 5 is denoted by the same reference sign, and an explanation thereof will be omitted, as appropriate.

A signal processing device 171 in FIG. 21 includes the demultiplexing section 61, an OAM decoding section 181, an object renderer 182, the core signal decoding section 62, a channel conversion section 183, a mixer section 184, and the panel output adjustment section 63. In addition, the panel output adjustment section 63 includes the panel output control section 72.

The demultiplexing section 61 extracts the overamplitude flags, the allocation gain information, the encoded OAM, and the encoded audio signals from the encoded data transmitted from the multiplexing section 23 of the signal processing device 131, by receiving and demultiplexing the encoded data.

The demultiplexing section 61 supplies the overamplitude flags and the allocation gain information to the panel output control section 72, supplies the encoded OAM to the OAM decoding section 181, and supplies the encoded audio signals to the core signal decoding section 62.

The OAM decoding section 181 decodes the encoded OAM supplied from the demultiplexing section 61, and supplies the resultant OAM to the object renderer 182.

The core signal decoding section 62 decodes the encoded audio signals supplied from the demultiplexing section 61, and supplies the resultant object signals to the object renderer 182. Further, the core signal decoding section 62 supplies post-pre-rendering channel audio signals resulting from the decoding, to the channel conversion section 183.

The object renderer 182 performs rendering such as VBAP on the basis of the OAM supplied from the OAM decoding section 181 and the object signals supplied from the core signal decoding section 62, and supplies the resultant rendered object signals to the mixer section 184.

For example, the object renderer 182 performs rendering similar to that performed by the object renderer 142 of the signal processing device 131 in FIG. 15. Accordingly, the rendered object signals of the respective channels are generated.

The channel conversion section 183 performs a conversion process of converting the post-pre-rendering channel audio signals supplied from the core signal decoding section 62, into converted channel signals of the respective channels in a channel structure other than the channel structure of the supplied channel audio signals.

Specifically, the channel conversion section 183 coverts channel audio signals in a prescribed channel structure, into converted channel signals in a channel structure (the number of channels) that can be reproduced by the decoding side, that is, the panel loudspeakers 52 and the sub-woofer 53.

For example, the channel conversion section 183 down-mixes or up-mixes the post-pre-rendering channel audio signals during the conversion process, thereby generates converted channel signals in a channel structure corresponding to the panel loudspeakers 52 and the sub-woofer 53. The channel conversion section 183 supplies the converted channel signals obtained as a result of the conversion process, to the mixer section 184.

It is to be noted that the conversion process is only required to be executed as needed. If the channel structure of the post-pre-rendering channel audio signals is sufficient as it is, the post-pre-rendering channel audio signals are directly outputted as converted channel signals.

The mixer section 184 combines the rendered object signals supplied from the object renderer 182 and the converted channel signals supplied from the channel conversion section 183, and supplies the resultant reproduction signals of the respective channels to the panel output control section 72.

Specifically, the mixer section 184 generates a reproduction signal of each channel by adding (mixing) a rendered object signal and a converted channel signal of the same channel.

The panel output control section 72 decides output signals to be supplied to the panel loudspeakers 52 and the sub-woofer 53, on the basis of the overamplitude flags and the allocation gain information supplied from the demultiplexing section 61 and the reproduction signals supplied from the mixer section 184.

Specifically, the panel output control section 72 generates output signals to be supplied to the panel loudspeakers 52 and the sub-woofer 53, on the basis of the overamplitude flags, the allocation gain information, and the reproduction signals. The output signals are generated from the object signals or the channel audio signals. Therefore, it can also be considered that the panel output control section 72 adjusts (decides) panel loudspeakers 52 and the sub-woofer 53 to become output destinations of the object signals and the channel audio signals.

<Explanation of Decoding Process>

Next, operation of the signal processing device 171 will be explained.

Specifically, a decoding process which is executed by the signal processing device 171 will be explained below with reference to the flowchart in FIG. 22.

At Step S211, the demultiplexing section 61 extracts overamplitude flags, allocation gain information, encoded OAM, and encoded audio signals by demultiplexing received encoded data.

The demultiplexing section 61 supplies the overamplitude flags and the allocation gain information to the panel output control section 72, supplies the encoded OAM to the OAM decoding section 181, and supplies the encoded audio signals to the core signal decoding section 62.

At Step S212, the OAM decoding section 181 decodes the encoded OAM supplied from the demultiplexing section 61, and supplies the resultant OAM to the object renderer 182.

At Step S213, the core signal decoding section 62 decodes the encoded audio signals supplied from the demultiplexing section 61, and supplies the resultant object signals to the object renderer 182. Further, the core signal decoding section 62 supplies post-pre-rendering channel audio signals resulting from the decoding, to the channel conversion section 183.

At Step S214, the object renderer 182 performs rendering on the basis of the OAM supplied from the OAM decoding section 181 and the object signals supplied from the core signal decoding section 62, and the resultant rendered object signals to the mixer section 184.

At Step S215, the channel conversion section 183 performs a conversion process on the post-pre-rendering channel audio signals supplied from the core signal decoding section 62, and the resultant converted channel signals are supplied to the mixer section 184.

At Step S216, the mixer section 184 generates reproduction signals of the respective channels, by combining the rendering object signals supplied from the object renderer 182 and the converted channel signals supplied from the channel conversion section 183. The mixer section 184 supplies the resultant reproduction signals to the panel output control section 72.

At Step S217, the panel output control section 72 generates output signals to be supplied to the panel loudspeakers 52 and the sub-woofer 53, on the basis of the overamplitude flags and the allocation gain information supplied from the demultiplexing section 61 and the reproduction signals supplied from the mixer section 184. For example, Step S217 which is similar to Step S44 in FIG. 8 is executed to generate output signals to be supplied to the panel loudspeakers 52 and the sub-woofer 53.

After the output signals are generated in the this manner, the panel output control section 72 supplies the output signals to the panel loudspeakers 52 and the sub-woofer 53 to reproduce content sounds. Then, the decoding process is completed.

As explained so far, the signal processing device 171 generates output signals to be supplied to the panel loudspeakers 52 and the sub-woofer 53 on the basis of overamplitude flags and allocation gain information. Accordingly, high-quality sounds can be reproduced with a low process load.

In the third embodiment explained so far, in a case where overamplitude will occur in a panel loudspeaker particularly when an object audio is reproduced by a panel loudspeaker system, a part of a reproduction signal is allocated to a panel loudspeaker positioned close to the object or a panel loudspeaker toward which the object is moving. Therefore, overamplitude is suppressed while the image sound impression and movement impression of objects are not degraded, and high-quality sounds can be reproduced.

Fourth Embodiment

Configuration Example of Streaming Distribution System

Meanwhile, in an object audio streaming distribution system, object audio, that is, object audio content is distributed, irrespective of a panel structure of a reproducing-side terminal device.

Therefore, object audio cannot be effectively reproduced because many objects need to be processed even in a case where the number of panel loudspeakers, that is, the number of panels at the reproduction side is small or because only a few objects may be transferred even in a case where the number of panels is sufficiently large.

To this end, panel structure information indicating the reproduction-side panel structure and maximum object number information indicating the maximum number of objects that can be processed at the reproduction side may be transferred to the distribution side. The maximum object number information can be obtained on the basis of computation resources on the reproduction side. As a result of this, the content can be properly distributed and reproduced.

In this case, on the basis of the panel structure information and the maximum object number information, the distribution side can perform proper pre-rendering according to the reproduction-side panel structure or the reproduction-side resource environment, and can allocate reproduction signals according to overamplitude.

Figure 23:
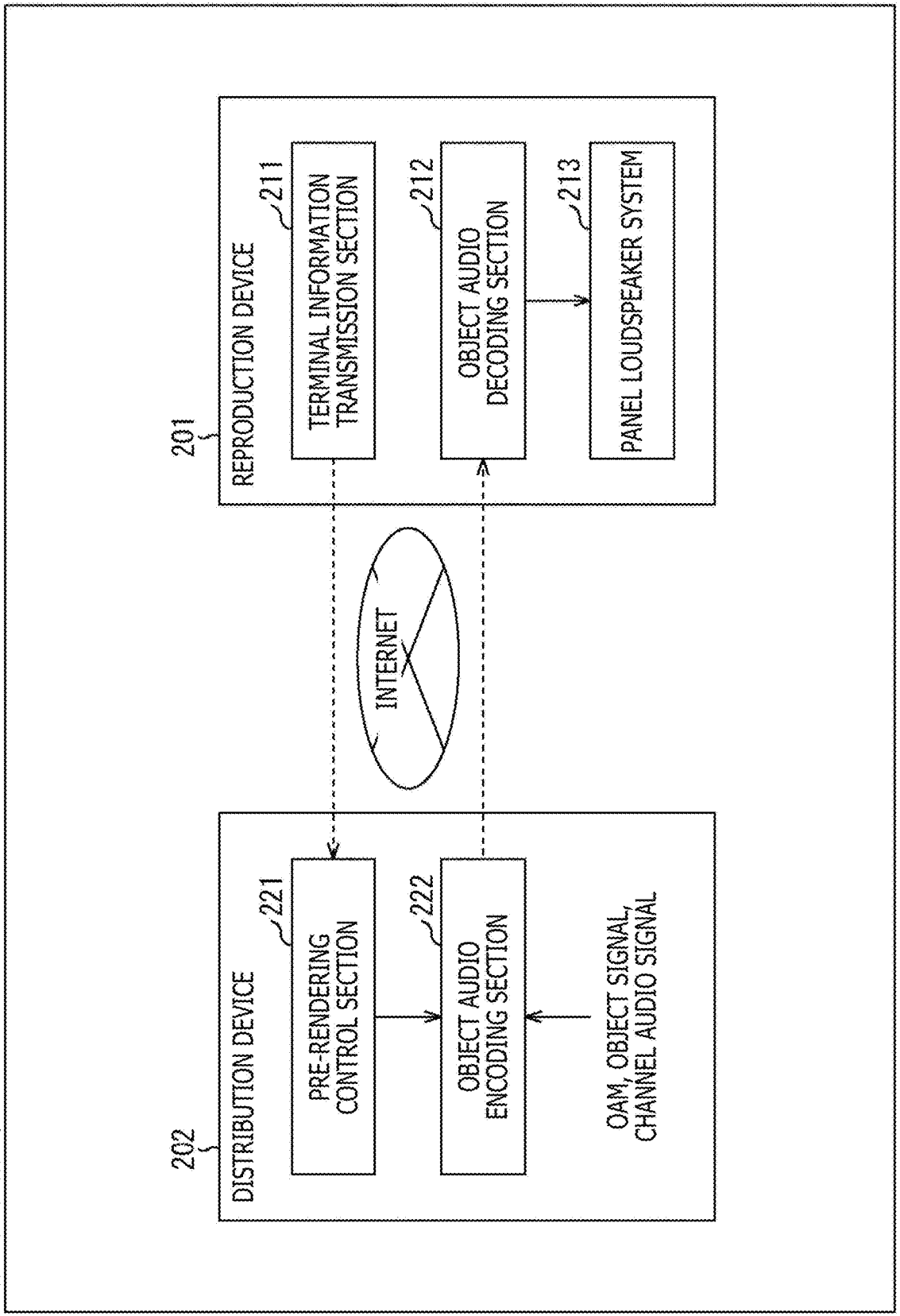
FIG. 23 is a diagram illustrating a configuration example of a streaming distribution system.

Such a streaming distribution system is formed, as illustrated in FIG. 23, for example.

The streaming distribution system illustrated in FIG. 23 includes a reproduction device 201 that is a reproduction-side terminal device, and a distribution device 202 that is a server on the object audio content distributing side.

The reproduction device 201 and the distribution device 202 are connected over a network such as the Internet. The distribution device 202 distributes content in an object audio scheme to the reproduction device 201.

The reproduction device 201 includes a terminal information transmission section 211, an object audio decoding section 212, and a panel loudspeaker system 213.

The distribution device 202 includes a pre-rendering control section 221 and an object audio encoding section 222.

The terminal information transmission section 211 of the reproduction device 201 transmits panel structure information and maximum object number information to the distribution device 202 over the network.

The object audio decoding section 212 has the same configuration as the signal processing device 171 illustrated in FIG. 21. The object audio decoding section 212 receives encoded content data transferred (transmitted) from the distribution device 202, and performs a decoding process on the data.

For example, the panel loudspeaker system 213 is the loudspeaker system including the panel loudspeakers 52 and the sub-woofer 53 illustrated in FIG. 21. The panel loudspeaker system 213 reproduces content sounds on the basis of output signals supplied from the object audio decoding section 212.

In addition, the pre-rendering control section 221 of the distribution device 202 decides a pre-rendering level on the basis of the panel structure information and maximum object number information received from the terminal information transmission section 211, and supplies the pre-rendering level to the object audio encoding section 222.

The object audio encoding section 222 generates encoded data on the basis of the pre-rendering level supplied from the pre-rendering control section 221 and supplied OAM, supplied object signals, and supplied channel audio signals, and transmits the encoded data to the reproduction device 201. The object audio encoding section 222 has the same configuration as the signal processing device 131 illustrated in FIG. 15.

<Explanation about Reproduction Process and Distribution Process>

Next, operations of the reproduction device 201 and the distribution device 202 will be explained.

Specifically, a reproduction process which is executed by the reproduction device 201 and a distribution process which is executed by the distribution device 202 will be explained below with reference to a flowchart in FIG. 24.

First, the reproduction process at the reproduction device 201 is started. As an initial process for the reproduction device 201 to issue a request for content streaming distribution to the distribution device 202, a process of obtaining the maximum number of objects is performed.

That is, the terminal information transmission section 211 of the reproduction device 201 generates maximum object number information by obtaining the maximum number of objects that is the object number maximum value which can be processed by the object audio decoding section 212 on the basis of the computation resources in the reproduction device 201.

Further, the terminal information transmission section 211 reads out panel structure information indicating the panel structure in the panel loudspeaker system 213, from a memory (not illustrated) or the like.

Then, at Step S241, the terminal information transmission section 211 transmits the maximum object number information and the panel structure information to the distribution device 202 over the network.

Accordingly, the request for content streaming distribution has been given from the reproduction device 201 to the distribution device 202. It is to be noted that, in a case where there is a change in the computation resources during reproduction of the content or in a case where the panel structure changes due to switching of the panel loudspeaker system 213, the maximum object number information and the panel structure information may be transmitted during reproduction of the content.

Further, at Step S261, in the distribution device 202, the pre-rendering control section 221 receives the maximum object number information and the panel structure information transmitted from the terminal information transmission section 211.

At Step S262, the pre-rendering control section 221 decides the pre-rendering level for streaming distribution of the content on the basis of the received maximum object number information and panel structure information.

For example, in a case where the number of panel loudspeakers (number of panels) constituting the panel loudspeaker system 213 is small, even when object signals of many objects are transmitted to the reproduction device 201, dynamic rendering of the objects provide less effect.

Therefore, in a case where the number of panels indicated by the panel structure information, that is, the number of the panel loudspeakers 52 is small, for example, the number of objects to be pre-rendered, that is, the number of the above-mentioned target objects is increased in order to achieve the effective process.

Further, in a case where the number of objects to be rendered by the reproduction device 201 side, that is, the number of non-target objects is greater than the maximum number of objects, an excess number of non-target objects from the maximum number of objects are discarded at the reproduction device 201. Here, non-target objects to be discarded are selected in order from the lowest priority level.

Therefore, in a case where the maximum number of objects is small, the number of objects to be pre-rendered, that is, the number of target objects is increased.

Here, specific examples of the maximum number of objects indicated by the maximum object number information and a pre-rendering level to be set for the number of panels indicated by the panel structure information, are illustrated in FIG. 25.

In FIG. 25, the pre-rendering level is set to Lev-1, Lev-2, or Lev-3.

In particular, in a case where the pre-rendering level is set to Lev-1, the number of target objects is the largest. In a case where the pre-rendering level is set to Lev-3, the number of target objects is the smallest.

In FIG. 25, the number of target objects becomes smaller with an increase of the maximum number of objects and the number of panels. That is, the number of non-target objects to be rendered at the reproduction device 201 side becomes larger.

For example, in a case where the number of panels is small (e.g. 1 or 2) and the maximum number of objects is also small (e.g. 1 to 15), the pre-rendering level is set to Lev-1.

After the pre-rendering level is decided in this manner, the pre-rendering control section 221 supplies the decided pre-rendering level to the object audio encoding section 222.

Figure 24:
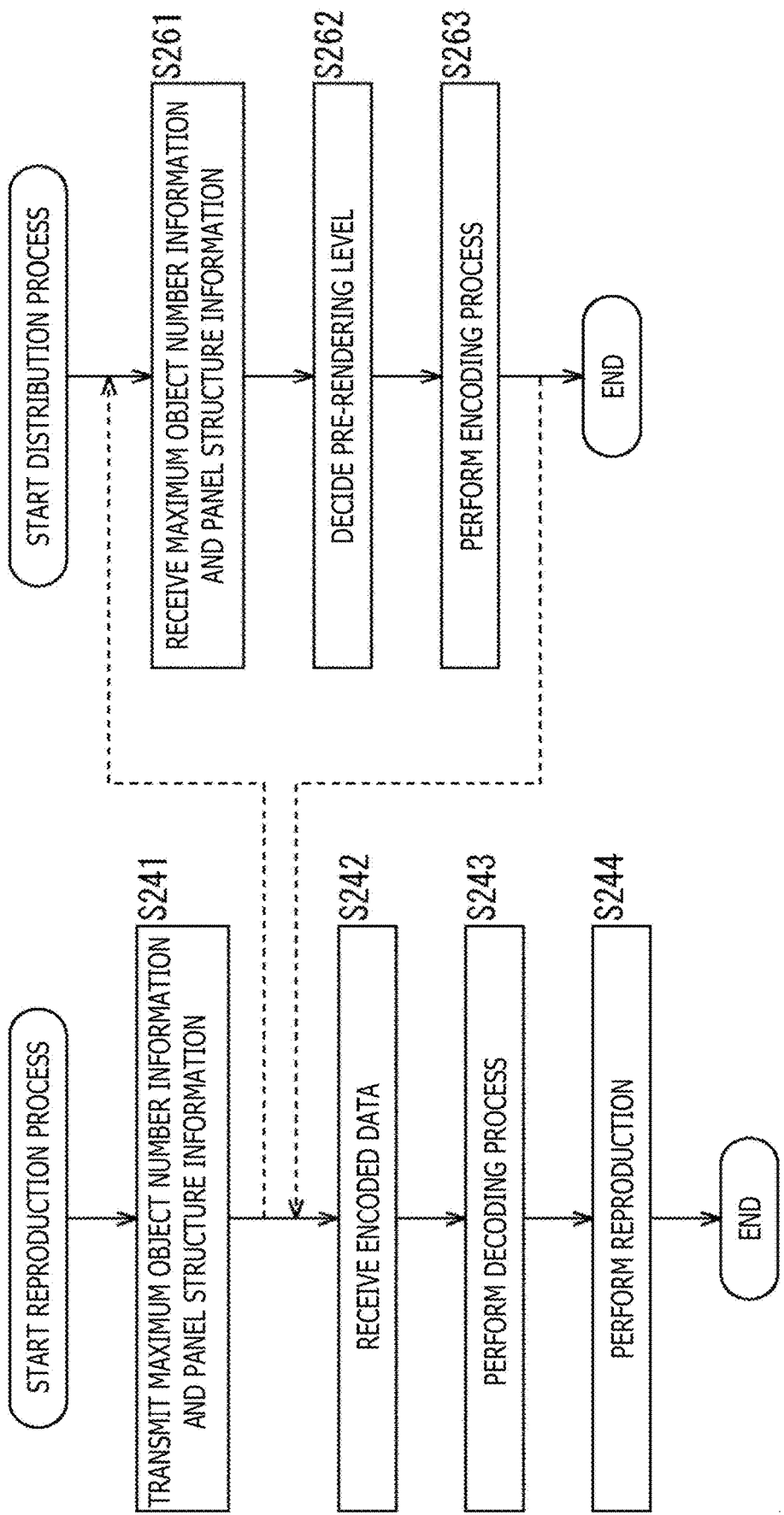
FIG. 24 is a flowchart for explaining a reproduction process and a distribution process.

Referring back to the flowchart in FIG. 24, the object audio encoding section 222 executes, at Step S263, an encoding process on the basis of the pre-rendering level supplied from the pre-rendering control section 221, supplied OAM, supplied object signals, and supplied channel audio signals.

At Step S263, the encoding process which has been explained with reference to FIG. 19 is executed. That is, encoded data is generated, and the object audio encoding section 222 transmits the resultant encoded data to the reproduction device 201.

After the encoding process is executed, as described so far, the distribution process by the distribution device 202 is ended.

In addition, after the encoding process is executed, the object audio decoding section 212 of the reproduction device 201 receives, at Step S242, the encoded data transmitted from the distribution device 202.

At Step S243, the object audio decoding section 212 generates output signals to be supplied to the panel loudspeaker system 213, by performing a decoding process based on the received encoded data.

Figure 22:
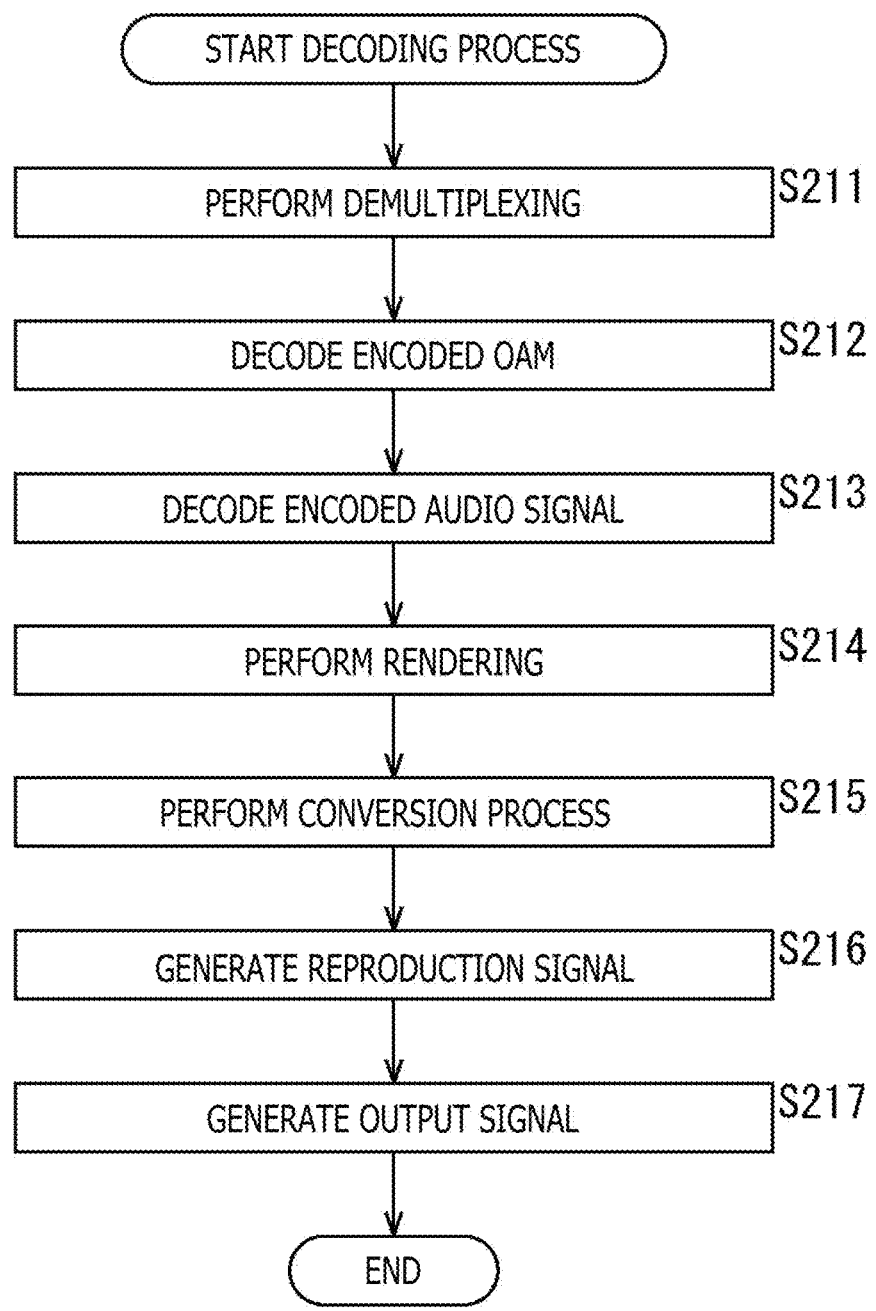
FIG. 22 is a flowchart for explaining a decoding process.

At Step S243, the decoding process having been explained with reference to FIG. 22 is executed to generate output signals to be supplied to the panel loudspeakers 52 and the sub-woofer 53 constituting the panel loudspeaker system 213.

The object audio decoding section 212 supplies the generated output signals to the panel loudspeaker system 213.

At Step S245, the panel loudspeaker system 213 reproduces content sounds on the basis of the output signals supplied from the object audio decoding section 212. Then, the reproduction process is completed.

In the above-mentioned manner, the reproduction device 201 transmits maximum object number information and panel structure information to the distribution device 202. In addition, the distribution device 202 decides a pre-rendering level on the basis of the maximum object number information and the panel structure information received from the reproduction device 201, and generates encoded data.

Accordingly, high-quality sounds can be reproduced with a low process load. Moreover, content can be distributed and reproduced more efficiently in accordance with the computation resources and the panel structure on the reproduction device 201 side.

Configuration Example of Computer

The above-mentioned series of processes can be executed by hardware, or can be executed by software. In a case where the series of processes is executed by software, a program forming the software is installed into a computer. Here, examples of the computer include a computer incorporated in dedicated-hardware, and a general-purpose personal computer capable of executing various functions by installing various programs thereinto.

FIG. 26 is a block diagram illustrating a hardware configuration example of a computer that executes the above-mentioned processes in accordance with a program.

In the computer, a CPU (Central Processing Unit) 501, a ROM (Read Only Memory) 502, and a RAM (Random Access Memory) 503 are mutually connected via a bus 504.

Further, an input/output interface 505 is connected to the bus 504. An input section 506, an output section 507, a recording section 508, a communication section 509, and a drive 510 are connected to the input/output interface 505.

The input section 506 includes a keyboard, a mouse, a microphone, an imaging element, or the like. The output section 507 includes a display, a loudspeaker, or the like. The recording section 508 includes a hard disk, a nonvolatile memory, or the like. The communication section 509 includes a network interface or the like. The drive 510 drives a removable recording medium 511 which is a magnetic disk, an optical disk, a magneto-optical disk, a semiconductor memory, or the like.

In a computer having the above-mentioned configuration, the CPU 501 loads a program recorded in the recording section 508, for example, into the RAM 503 via the input/output interface 505 and the bus 504, and executes the program. Accordingly, the above-mentioned series of processes is executed.

The program which is executed by the computer (CPU 501) can be provided by being recorded in the removable recording medium 511 serving as a package medium, for example. Alternatively, the program can be provided via a wired or wireless transmission medium such as a local area network, the Internet, or digital satellite broadcasting.

In the computer, when the removable recording medium 511 is attached to the drive 510, the program can be installed into the recording section 508 via the input/output interface 505. Moreover, the program can be received at the communication section 509 via a wired or wireless transmission medium, and can be installed into the recording section 508. Alternatively, the program can be preliminarily installed in the ROM 502 and the recording section 508.

It is to be noted that the program which is executed by the computer may be a program for executing the processes in the time-series order explained herein, or may be a program for executing the processes at a necessary timing such as a timing when a call is made.

In addition, the embodiments of the present technology are not limited to the above-mentioned embodiments, and various changes can be made within the scope of the gist of the present technology.

For example, the present technology can be configured by cloud computing in which one function is shared and cooperatively processed by a plurality of devices over a network.

In addition, the steps having been explained with reference to the above-mentioned flowcharts may be executed by one device, or may be cooperatively executed by a plurality of devices.

Moreover, in a case where a plurality of processes is included in one step, the plurality of processes included in the one step may be executed by one device, or may be cooperatively executed by a plurality of devices.

Furthermore, the present technology can have the following configurations.

(1)

A signal processing device including:
- a demultiplexing section that demultiplexes encoded data to extract encoded audio signals and overamplitude flags having been generated for a plurality of respective panel loudspeakers and each indicating whether overamplitude will occur in the corresponding panel loudspeaker;
- a decoding section that decodes the encoded audio signals; and
- an adjustment section that adjusts audio signals to be supplied to the plurality of the respective panel loudspeakers on the basis of the overamplitude flags and audio signals resulting from the decoding.

(2)

The signal processing device according to (1), in which in a case where occurrence of overamplitude is expected in an output destination panel loudspeaker defined as an output destination of a prescribed one of the audio signals resulting from the decoding, the adjustment section decides, as output destinations of the prescribed audio signal, the output destination panel loudspeaker and another panel loudspeaker in which overamplitude will not occur.

(3)

The signal processing device according to (2), in which on the basis of the audio signals, the adjustment section calculates an allocation gain of outputting the prescribed audio signal to the other panel loudspeaker.

(4)

The signal processing device according to (2) or (3), in which the other panel loudspeaker is disposed adjacent to the output destination panel loudspeaker.

(5)

The signal processing device according to any one of (2) to (4), in which the other panel loudspeaker is a sub-woofer.

(6)

The signal processing device according to any one of (1) to (5), in which the audio signals are multichannel signals, and the audio signals of output channels are defined in each of the plurality of the panel loudspeakers.

(7)
The signal processing device according to (2), in which each of the audio signals is an object signal of an audio object.

(8)
The signal processing device according to (7), in which the other panel loudspeaker to become an output destination of the prescribed audio signal is decided on the basis of presence or absence of motion of the audio object corresponding to the prescribed audio signal.

(9)
The signal processing device according to (8), in which in a case where the audio object stays motionless, a panel loudspeaker, of the panel loudspeakers, positioned closest to the audio object is decided as the other panel loudspeaker.

(10)
The signal processing device according to (8), in which in a case where the audio object is moving, the other panel loudspeaker is decided on the basis of a moving direction of the audio object.

(11)
The signal processing device according to (2), in which the encoded data includes an allocation gain of outputting the prescribed audio signal to the other panel loudspeaker, and
the adjustment section adjusts audio signals to be supplied to the plurality of the respective panel loudspeakers on the basis of the overamplitude flags, the audio signals resulting from the decoding, and the allocation gain.

(12)
The signal processing device according to any one of (1) to (11), in which
the encoded data includes the overamplitude flags for the panel loudspeakers in each of a plurality of different panel structures that each include a plurality of the panel loudspeakers.

(13)
A signal processing method that is performed by a signal processing device, the method including:
demultiplexing encoded data to extract encoded audio signals and overamplitude flags having been generated for a plurality of respective panel loudspeakers and each indicating whether overamplitude will occur in the corresponding panel loudspeaker;
decoding the encoded audio signals; and
adjusting audio signals to be supplied to the plurality of the respective panel loudspeakers on the basis of the overamplitude flags and audio signals resulting from the decoding.

(14)
A program for causing a computer to execute a process including the steps of:
demultiplexing encoded data to extract encoded audio signals and overamplitude flags having been generated for a plurality of respective panel loudspeakers and each indicating whether overamplitude will occur in the corresponding panel loudspeaker is expected;
decoding the encoded audio signals; and
adjusting audio signals to be supplied to the plurality of the respective panel loudspeakers on the basis of the overamplitude flags and audio signals resulting from the decoding.

(15)
A signal processing device including:
an overamplitude detection section that detects whether, when each of a plurality of respective panel loudspeakers reproduces a sound based on an audio signal, overamplitude will occur in the corresponding panel loudspeaker, and generates overamplitude flags indicating the detection results;
an encoding section that encodes the audio signals; and
a multiplexing section that generates encoded data by multiplexing the overamplitude flags for the plurality of the respective panel loudspeakers and encoded audio signals resulting from the encoding.

(16)
The signal processing device according to (15), in which the audio signals are multichannel signals, and the audio signals of output channels are defined in each of the plurality of the panel loudspeakers.

(17)
The signal processing device according to (15) or (16), further including:
an allocation gain calculation section that, in a case where a possibility of overamplitude in an output destination panel loudspeaker defined as an output destination of a prescribed one of the audio signals is detected, calculates an allocation gain of outputting the prescribed audio signal to the output destination panel loudspeaker and another panel loudspeaker, on the basis of the audio signals, in which
the multiplexing section generates the encoded data by multiplexing the overamplitude flags, the encoded audio signals, and the allocation gain.

(18)
The signal processing device according to any one of (15) to (17), in which
the overamplitude detection section generates the overamplitude flags for the panel loudspeakers in each of a plurality of different panel structures that each include a plurality of the panel loudspeakers.

(19)
A signal processing method that is performed by a signal processing device, the method including:
detecting whether, when each of a plurality of panel loudspeakers reproduces a sound based on an audio signal, overamplitude will occur in the panel loudspeaker, and generating overamplitude flags indicating the detection results;
encoding the audio signals; and
generating encoded data by multiplexing the overamplitude flags for the plurality of the respective panel loudspeakers and encoded audio signals resulting from the encoding.

(20)
A program for causing a computer to execute a process including the steps of:
detecting whether, when each of a plurality of panel loudspeakers reproduces a sound based on an audio signal, overamplitude will occur in the panel loudspeaker, and generating overamplitude flags indicating the detection results;
encoding the audio signals; and
generating encoded data by multiplexing the overamplitude flags for the plurality of the respective panel loudspeakers and encoded audio signals resulting from the encoding.

REFERENCE SIGNS LIST

11: Signal processing device
21: Panel overamplitude detection section
22: Core signal encoding section 23: Multiplexing section
51: Signal processing device
52-1 to 52-N, 52: Panel loudspeaker
53: Sub-woofer
61: Demultiplexing section
62: Core signal decoding section
63: Panel output adjustment section
71: Allocation gain calculation section
72: Panel output control section

The invention claimed is:

1. A signal processing device comprising:
a demultiplexing section that demultiplexes encoded data to extract encoded audio signals and overamplitude flags having been generated for a plurality of respective panel loudspeakers and each indicating whether overamplitude will occur in the corresponding panel loudspeaker;
a decoding section that decodes the encoded audio signals; and
an adjustment section that adjusts audio signals to be supplied to the plurality of the respective panel loudspeakers on a basis of the overamplitude flags and audio signals resulting from the decoding.

2. The signal processing device according to claim 1, wherein
in a case where occurrence of overamplitude is expected in an output destination panel loudspeaker defined as an output destination of a prescribed one of the audio signals resulting from the decoding, the adjustment section decides, as output destinations of the prescribed audio signal, the output destination panel loudspeaker and another panel loudspeaker in which overamplitude will not occur.

3. The signal processing device according to claim 2, wherein
on a basis of the audio signals, the adjustment section calculates an allocation gain of outputting the prescribed audio signal to the other panel loudspeaker.

4. The signal processing device according to claim 2, wherein
the other panel loudspeaker is disposed adjacent to the output destination panel loudspeaker.

5. The signal processing device according to claim 2, wherein
the other panel loudspeaker is a sub-woofer.

6. The signal processing device according to claim 1, wherein
the audio signals are multichannel signals, and the audio signals of output channels are defined in each of the plurality of the panel loudspeakers.

7. The signal processing device according to claim 2, wherein
each of the audio signals is an object signal of an audio object.

8. The signal processing device according to claim 7, wherein
the other panel loudspeaker to become an output destination of the prescribed audio signal is decided on a basis of presence or absence of motion of the audio object corresponding to the prescribed audio signal.

9. The signal processing device according to claim 8, wherein
in a case where the audio object stays motionless, a panel loudspeaker, of the panel loudspeakers, positioned closest to the audio object is decided as the other panel loudspeaker.

10. The signal processing device according to claim 8, wherein
in a case where the audio object is moving, the other panel loudspeaker is decided on a basis of a moving direction of the audio object.

11. The signal processing device according to claim 2, wherein
the encoded data includes an allocation gain of outputting the prescribed audio signal to the other panel loudspeaker, and
the adjustment section adjusts audio signals to be supplied to the plurality of the respective panel loudspeakers on a basis of the overamplitude flags, the audio signals resulting from the decoding, and the allocation gain.

12. The signal processing device according to claim 1, wherein
the encoded data includes the overamplitude flags for the panel loudspeakers in each of a plurality of different panel structures that each include a plurality of the panel loudspeakers.

13. A signal processing method that is performed by a signal processing device, the method comprising:
demultiplexing encoded data to extract encoded audio signals and overamplitude flags having been generated for a plurality of respective panel loudspeakers and each indicating whether overamplitude will occur in the corresponding panel loudspeaker;
decoding the encoded audio signals; and
adjusting audio signals to be supplied to the plurality of the respective panel loudspeakers on a basis of the overamplitude flags and audio signals resulting from the decoding.

14. A program stored on a non-transitory computer-readable medium for causing a computer to execute a process including the steps of:
demultiplexing encoded data to extract encoded audio signals and overamplitude flags having been generated for a plurality of respective panel loudspeakers and each indicating whether overamplitude will occur in the corresponding panel loudspeaker is expected;
decoding the encoded audio signals; and
adjusting audio signals to be supplied to the plurality of the respective panel loudspeakers on a basis of the overamplitude flags and audio signals resulting from the decoding.

15. A signal processing device comprising:
an overamplitude detection section that detects whether, when each of a plurality of respective panel loudspeakers reproduces a sound based on an audio signal, overamplitude will occur in the corresponding panel loudspeaker, and generates overamplitude flags indicating the detection results;
an encoding section that encodes the audio signals; and
a multiplexing section that generates encoded data by multiplexing the overamplitude flags for the plurality of the respective panel loudspeakers and encoded audio signals resulting from the encoding.

16. The signal processing device according to claim 15, wherein
the audio signals are multichannel signals, and the audio signals of output channels are defined in each of the plurality of the panel loudspeakers.

17. The signal processing device according to claim 15, further comprising:
an allocation gain calculation section that, in a case where a possibility of overamplitude in an output destination panel loudspeaker defined as an output destination of a prescribed one of the audio signals is detected, calculates an allocation gain of outputting the prescribed audio signal to the output destination panel loudspeaker and another panel loudspeaker, on a basis of the audio signals, wherein the multiplexing section generates the encoded data by multiplexing the overamplitude flags, the encoded audio signals, and the allocation gain.

18. The signal processing device according to claim 15, wherein the overamplitude detection section generates the overamplitude flags for the panel loudspeakers in each of a plurality of different panel structures that each include a plurality of the panel loudspeakers.

19. A signal processing method that is performed by a signal processing device, the method comprising:

detecting whether, when each of a plurality of panel loudspeakers reproduces a sound based on an audio signal, overamplitude will occur in the panel loudspeaker, and generating overamplitude flags indicating the detection results;

encoding the audio signals; and generating encoded data by multiplexing the overamplitude flags for the plurality of the respective panel loudspeakers and encoded audio signals resulting from the encoding.

20. A program stored on a non-transitory computer-readable medium for causing a computer to execute a process including the steps of:

detecting whether, when each of a plurality of panel loudspeakers reproduces a sound based on an audio signal, overamplitude will occur in the panel loudspeaker, and generating overamplitude flags indicating the detection results;

encoding the audio signals; and generating encoded data by multiplexing the overamplitude flags for the plurality of the respective panel loudspeakers and encoded audio signals resulting from the encoding.

* * * * *